(12) United States Patent
Takeuchi

(10) Patent No.: US 9,132,611 B2
(45) Date of Patent: Sep. 15, 2015

(54) RESIN COMPOSITION, PREPREG USING SAME, METAL FOIL WITH RESIN, ADHESIVE FILM, AND METAL-CLAD LAMINATE

(75) Inventor: Kazumasa Takeuchi, Tsukuba (JP)

(73) Assignee: HITACHI CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 13/498,712

(22) PCT Filed: Sep. 28, 2010

(86) PCT No.: PCT/JP2010/066807
§ 371 (c)(1),
(2), (4) Date: Apr. 23, 2012

(87) PCT Pub. No.: WO2011/040399
PCT Pub. Date: Apr. 7, 2011

(65) Prior Publication Data
US 2012/0244332 A1  Sep. 27, 2012

(30) Foreign Application Priority Data

Sep. 30, 2009 (JP) ................ P2009-228195
Oct. 30, 2009 (JP) ................ P2009-250682
Nov. 27, 2009 (JP) ................ P2009-270550

(51) Int. Cl.
| | |
|---|---|
| *C08L 79/08* | (2006.01) |
| *C08G 73/10* | (2006.01) |
| *C08F 283/04* | (2006.01) |
| *C08L 63/00* | (2006.01) |
| *B32B 15/08* | (2006.01) |
| *B32B 17/04* | (2006.01) |
| *B32B 27/04* | (2006.01) |
| *B32B 27/34* | (2006.01) |
| *C08G 73/14* | (2006.01) |
| *C08L 83/10* | (2006.01) |
| *C09J 163/00* | (2006.01) |
| *C09J 179/08* | (2006.01) |
| *C09J 183/10* | (2006.01) |
| *C08G 77/455* | (2006.01) |
| *H05K 1/03* | (2006.01) |

(52) U.S. Cl.
CPC ............... *B32B 15/08* (2013.01); *B32B 17/04* (2013.01); *B32B 27/04* (2013.01); *B32B 27/34* (2013.01); *C08G 73/105* (2013.01); *C08G 73/106* (2013.01); *C08G 73/1035* (2013.01); *C08G 73/14* (2013.01); *C08L 79/08* (2013.01); *C08L 83/10* (2013.01); *C09J 163/00* (2013.01); *C09J 179/08* (2013.01); *C09J 183/10* (2013.01); *C08G 77/455* (2013.01); *C08L 63/00* (2013.01); *H05K 1/0346* (2013.01); *Y10T 428/264* (2015.01); *Y10T 428/31681* (2015.04)

(58) Field of Classification Search
CPC ...................................................... C08L 79/08
See application file for complete search history.

(56) References Cited

U.S. PATENT DOCUMENTS

| | | | | |
|---|---|---|---|---|
| 4,448,844 | A | * 5/1984 | Osada et al. .................. | 428/375 |
| 6,887,967 | B2 | * 5/2005 | Ichinose et al. .............. | 528/170 |
| 2006/0199923 | A1 | 9/2006 | Akiba et al. | |
| 2009/0323300 | A1 | 12/2009 | Fujimoto et al. | |

FOREIGN PATENT DOCUMENTS

| | | |
|---|---|---|
| EP | 1 123 944 A1 | 8/2001 |
| EP | 2 070 961 A1 | 6/2009 |
| JP | 09-043413 A | 2/1997 |
| JP | 10-246958 A | 9/1998 |
| JP | 2001-240670 A | 9/2001 |
| JP | 2001-316469 | * 11/2001 |
| JP | 2003-055486 A | 2/2003 |
| JP | 2004-281066 A | 10/2004 |
| JP | 2005-200532 A | 7/2005 |
| JP | 2006-124670 A | 5/2006 |
| JP | 2007-217496 A | 8/2007 |
| JP | 2007-217498 A | 8/2007 |
| JP | 2008-103651 A | 5/2008 |
| JP | 2008-115366 A | 5/2008 |
| JP | 2008-132750 A | 6/2008 |
| JP | 2008-144161 A | 6/2008 |
| JP | 2009-007551 A | 1/2009 |
| JP | 2009-108307 A | 5/2009 |
| JP | 2009-119855 A | 6/2009 |
| TW | 200831551 | 8/2008 |
| WO | WO 2007/125922 A1 | 11/2007 |
| WO | WO 2008/041426 A1 | 4/2008 |

OTHER PUBLICATIONS

Machine translation JP 2001-316469.*
International Search Report issued in corresponding International Application No. PCT/JP2010/066807, mailed Nov. 16, 2010.
European Search Reoort from European Patent Office in a corresponding patent application No. PCT/JP2010/066807 dated May 21, 2014.
International Preliminary Report on Patentability, issued from the International Bureau, in counterpart International Application No. PCT/JP2010/066807, dated May 18, 2012, pp. 1-7.

* cited by examiner

*Primary Examiner* — Ana Woodward
(74) *Attorney, Agent, or Firm* — Fitch, Even, Tabin & Flannery, LLP

(57) ABSTRACT

A resin composition comprising a polyamideimide and a polyfunctional glycidyl compound, the polyamideimide having 2 or more carboxyl groups on at least one end of the molecular chain.

7 Claims, 4 Drawing Sheets

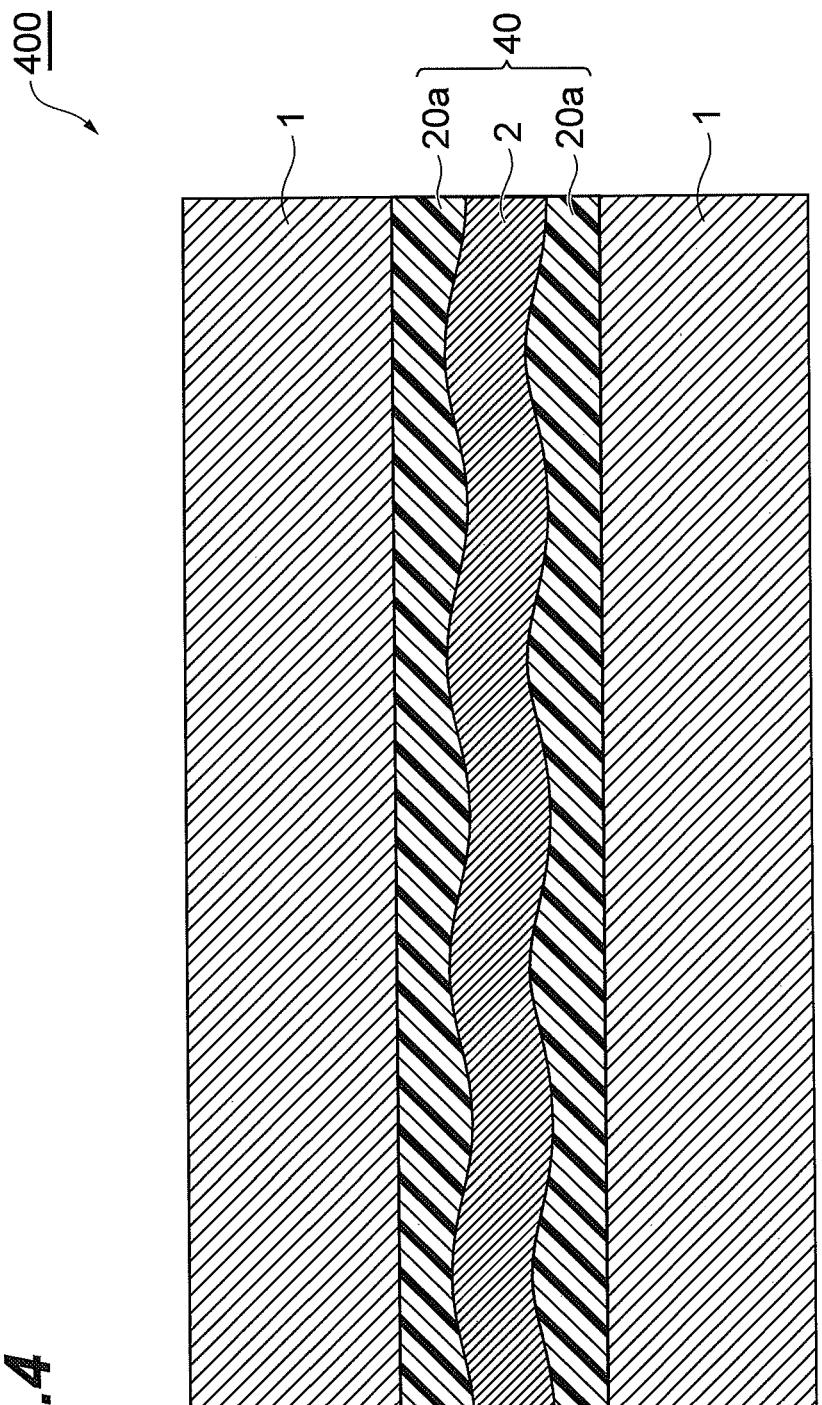

RESIN COMPOSITION, PREPREG USING SAME, METAL FOIL WITH RESIN, ADHESIVE FILM, AND METAL-CLAD LAMINATE

TECHNICAL FIELD

The present invention relates to a resin composition, a prepreg using it, a metal foil with a resin, an adhesive film and a metal-clad laminate.

BACKGROUND ART

Laminated sheets for printed circuit boards are known which have a prescribed number of stacked prepregs, each obtained by impregnating a fiber base material with an electrical insulating resin composition, heated and pressed into an integral form. Also, metal-clad laminates are used when forming printed circuits by a subtractive process. Such metal-clad laminates are manufactured by stacking metal foil such as copper foil on the prepreg surface (one or both sides), and heating and pressing the stack. Thermosetting resins such as phenol resins, epoxy resins, polyimide resins and bismaleimide-triazine resins are widely used as electrical insulating resins, and thermoplastic resins such as fluorine resins and polyphenylene ether resins are also sometimes used.

However, the advancing development of data terminal devices such as personal computers and cellular phones has led to reduced sizes and higher densities of the printed circuit boards mounted therein. The forms in which electronic components are mounted in printed circuit boards range from pin insertion types to surface mounting types, and are gradually shifting toward area arrays such as BGA (ball grid arrays) that employ plastic boards. For a substrate on which a bare chip such as BGA is directly mounted, connection between the chip and substrate is usually accomplished by wire bonding which employs thermosonic bonding. Bare chip-mounted substrates are thus exposed to high temperatures of 150° C. and above, and the electrical insulating resins must therefore have a certain degree of heat resistance.

With trends toward lead-free solder from the viewpoint of environmental concerns, the higher solder melting temperatures are resulting in demand for greater heat resistance for substrates, while demands for halogen-free materials are also increasing, such that it is becoming difficult to use bromine-based flame retardants.

Repairability, which allows removal of mounted chips, is also often in demand, and this requires approximately the same amount of heat as for mounting of the chips, as the chip must be remounted later on the substrate and subjected to further heat treatment. Conventional insulating resin systems have also sometimes caused peeling between the resins and fiber base materials. Consequently, "repairable" substrates must exhibit heat resistance at high temperatures.

There have been proposed prepregs comprising a fiber base material impregnated with a resin composition with a thermosetting resin such as an epoxy resin, and a polyamideimide as essential components, in order to obtain excellent heat resistance and improve the fine-pitch wiring formability (see Patent document 1, for example). However, resin compositions comprising a polyamideimide and an epoxy resin, while exhibiting high bonding strength for various adherends and having excellent heat resistance, also have strong cohesion between molecules and therefore exhibit high melt viscosity during hot molding and thus inferior moldability. Methods have therefore been proposed in which moldability is obtained by low molecularization of the polyamideimide molecular weight to a degree that permits molding, or by combination of an epoxy resin that exhibits low melt viscosity (see Patent documents 2 and 3, for example).

CITATION LIST

Patent Literature

[Patent document 1] Japanese Unexamined Patent Application Publication No. 2003-55486
[Patent document 2] Japanese Unexamined Patent Application Publication No. 2005-200532
[Patent document 3] Japanese Unexamined Patent Application Publication No. 2006-124670

SUMMARY OF INVENTION

Technical Problem

It has become necessary to house printed circuit boards with parts mounted in the increasingly limited spaces resulting from greater miniaturization and higher performance of electronic devices. However, the resin compositions described in Patent documents 2 and 3 have greater reduction in elongation after heat curing, compared to the original properties of polyamideimides, while the bendability of the base materials employing them are also insufficient, making them poorly suitable for the aforementioned purposes.

It is an object of the present invention to solve the aforementioned problems of the prior art and to provide a resin composition that can form products with excellent moldability, low reduction in cured elongation, the ability to fold when formed into printed circuit boards, and capable of being housed at high density in electronic device packages. It is another object of the invention to provide a prepreg using the resin composition, a metal foil with a resin, an adhesive film and a metal-clad laminate.

Solution to Problem

The present invention provides a first resin composition comprising a polyamideimide and a polyfunctional glycidyl compound, the polyamideimide having 2 or more carboxyl groups on at least one end of the molecular chain.

The first resin composition of the invention having such a construction has excellent moldability when worked into a B-stage state film or the like, is capable of hot molding, and has low reduction in elongation after thermosetting. According to the first resin composition of the invention it is possible to form a printed circuit board with desired foldability, and capable of being housed at high density in electronic device packages. The first resin composition of the invention also has excellent adhesion with metal foils and fiber base materials, and excellent heat resistance, and is useful as a material for interlayer connection on a multilayer printed circuit board or a material for a printed circuit board such as a metal-clad laminate. In addition, since it has low reduction in cured elongation, the first resin composition of the invention can be expected to alleviate stress produced between metal foils or fiber base materials and the resin composition during curing, when it is used as a material for a printed circuit board.

The invention also provides a second resin composition wherein the polyamideimide has 2 or more carboxyl groups on at least one end of the molecular chain, and has a polysiloxaneimide structure in the molecular chain, the polysiloxaneimide structure having an unsaturated bond-containing group on a side chain.

The resin compositions described in Patent documents 2 and 3 have greater reduction in elongation after heat curing, compared to the original properties of polyamideimides, and are in need of improvement in terms of stress relaxation or shock absorption.

In contrast, the second resin composition of the invention having such a construction has excellent moldability when worked into a B-stage state film or the like, is capable of hot molding, and has low reduction in elongation after thermosetting, while also having satisfactory adhesion with copper foils, glass and polyimides that are used together as circuit board materials, and being able to form cured products with a sufficiently low elastic modulus. According to the second resin composition of the invention it is possible to form a printed circuit board with desired foldability, and capable of being housed at high density in electronic device packages. The second resin composition of the invention also has excellent adhesion with metal foils and fiber base materials, and excellent heat resistance, and is useful as a material for interlayer connection on a multilayer printed circuit board or a material for a printed circuit board such as a metal-clad laminate. In addition, since it has low reduction in cured elongation, the second resin composition of the invention can alleviate stress produced between metal foils or fiber base materials and the resin composition during curing, when it is used as a material for a printed circuit board. In addition, the second resin composition of the invention has a low elastic modulus as a cured resin and is useful as a stress relaxation material or shock absorption material.

The polyamideimide in the second resin composition of the invention preferably further comprises a polyoxypropyleneimide structure in the molecular chain.

If the polyamideimide in the second resin composition of the invention includes such a structure, the resin composition will have an even lower elastic modulus and increased elongation.

The polyamideimide in the first resin composition and second resin composition of the invention is preferably one wherein at least one end of the molecular chain of the polyamideimide is an aromatic amide group with 2 or more carboxyl groups.

If the polyamideimide in the first resin composition of the invention includes such a group, the heat resistance and hydrolysis resistance of the resin composition will be increased.

If the polyamideimide in the second resin composition of the invention includes such a group, the heat resistance and hydrolysis resistance of the resin composition will be increased, and reduction in the cured elongation will be inhibited.

The polyamideimide in the first resin composition and second resin composition of the invention is preferably a polyamideimide obtained by reacting a dicarboxylic acid and a diisocyanate in a proportion of 1.05-1.45 mol of the diisocyanate to 1 mol of the dicarboxylic acid, and then further reacting the product with a compound having 3 or more carboxyl groups.

This type of polyamideimide will allow the viscosity of the resin composition to be modified, while also improving the film moldability when the resin has been worked into a film or the like.

The compound with 3 or more carboxyl groups in the first resin composition and second resin composition of the invention is preferably an aromatic tricarboxylic acid which does not undergo dehydrating cyclization.

This type of compound with 3 or more carboxyl groups will improve the heat resistance or humidity resistance, when the resin composition has been worked into a film.

The polyamideimide in the first resin composition and second resin composition of the invention preferably comprises an organopolysiloxane structure.

If the polyamideimide comprises an organopolysiloxane structure, the flexibility of the polyamideimide will be increased. In addition, when the resin composition is formed into a film, the film drying property will be increased and it will be easier to lower the volatile components of the film, while the elastic modulus of the film can also be reduced.

The invention further provides a first prepreg obtained by impregnating a first resin composition of the invention into a glass cloth with a thickness of no greater than 50 μm.

The invention still further provides a second prepreg obtained by impregnating a second resin composition of the invention into a glass cloth with a thickness of no greater than 50 μm.

The resin composition in the first prepreg of the invention is in the B-stage state. Since the first prepreg of the invention comprises a first resin composition of the invention, it exhibits excellent moldability and can form products with low reduction in elongation after thermosetting. With this prepreg, it is possible to form a printed circuit board with desired foldability, and capable of being housed at high density in electronic device packages. The prepreg also has excellent adhesion with metal foils and fiber base materials, and excellent heat resistance, and is useful as a material for a printed circuit board such as a metal-clad laminate. In addition, since it has low reduction in cured elongation, the prepreg can be expected to alleviate stress produced between metal foils or fiber base materials and the resin composition during curing, when it is used as a material for a printed circuit board.

The resin composition in the second prepreg of the invention is in the B-stage state. Since the second prepreg of the invention comprises a second resin composition of the invention, it exhibits excellent moldability, and can form products with low reduction in elongation after thermosetting, and a sufficiently low elastic modulus after thermosetting. In addition, this prepreg allows formation of a printed circuit board with desired foldability, and capable of being housed at high density in electronic device packages. The prepreg has excellent adhesion with metal foils and fiber base materials, and excellent heat resistance, and is useful as a material for a printed circuit board such as a metal-clad laminate. In addition, since it has low reduction in cured elongation, the prepreg can alleviate stress produced between metal foils or fiber base materials and the resin composition during curing, when it is used as a material for a printed circuit board. In addition, the prepreg has a low elastic modulus as a cured resin and is useful as a stress relaxation material or shock absorption material.

The invention further provides a first metal foil with a resin comprising a resin layer in the B-stage state, formed from the first resin composition of the invention, and a metal foil.

The invention still further provides a second metal foil with a resin comprising a resin layer in the B-stage state, formed from the second resin composition of the invention, and a metal foil.

Since the first metal foil with a resin of the invention comprises a resin layer formed from a first resin composition of the invention, it exhibits excellent moldability and can form products with low reduction in elongation after thermosetting. With this metal foil with a resin, it is possible to form a printed circuit board with desired foldability, and capable of being housed at high density in electronic device packages. The metal foil with a resin also has excellent adhesion with metal foils and fiber base materials, and excellent heat resistance, and is useful as an interlayer connection material in a multilayer printed circuit board. In addition, since it has low reduction in cured elongation, the metal foil with a resin can be expected to alleviate stress produced between metal foils or fiber base materials and the resin composition during curing, when it is used as a material for a printed circuit board.

Since the second metal foil with a resin of the invention comprises a resin layer formed from a second resin composition of the invention, it exhibits excellent moldability, and can form products with low reduction in elongation after thermosetting and with a sufficiently low elastic modulus after thermosetting. With this metal foil with a resin, it is also possible to form a printed circuit board with desired foldability, and capable of being housed at high density in electronic device packages. The metal foil with a resin has excellent adhesion with metal foils and fiber base materials, and excellent heat resistance, and is useful as an interlayer connection material in a multilayer printed circuit board. In addition, since it has low reduction in cured elongation, the metal foil with a resin can alleviate stress produced between metal foils or fiber base materials and the resin composition during curing, when it is used as a material for a printed circuit board. In addition, the metal foil with a resin has a low elastic modulus as a cured resin and is useful as a stress relaxation material or shock absorption material.

The invention further provides a first adhesive film formed from a first resin composition of the invention.

The invention further provides a second adhesive film formed from a second resin composition of the invention.

The resin composition in the first adhesive film of the invention is in the B-stage state. Since the first adhesive film of the invention is formed from a first resin composition of the invention, it exhibits excellent moldability and can form products with low reduction in elongation after thermosetting. With this adhesive film, it is possible to form a printed circuit board with desired foldability, and capable of being housed at high density in electronic device packages. The adhesive film also has excellent adhesion with metal foils and fiber base materials, and excellent heat resistance, and is useful as an interlayer connection material in a multilayer printed circuit board. In addition, since it has low reduction in cured elongation, the adhesive film can be expected to alleviate stress produced between metal foils or fiber base materials and the resin composition during curing, when it is used as a material for a printed circuit board.

The resin composition in the second adhesive film of the invention is in the B-stage state. Since the second adhesive film of the invention is formed from a second resin composition of the invention, it exhibits excellent moldability and can form products with low reduction in elongation after thermosetting, as well as a sufficiently low elastic modulus after thermosetting. With this adhesive film, it is also possible to form a printed circuit board with desired foldability, and capable of being housed at high density in electronic device packages. The adhesive film also has excellent adhesion with metal foils and fiber base materials, and excellent heat resistance, and is useful as an interlayer connection material in a multilayer printed circuit board. In addition, since it has low reduction in cured elongation, the adhesive film can alleviate stress produced between metal foils or fiber base materials and the resin composition during curing, when it is used as a material for a printed circuit board. In addition, the adhesive film has a low elastic modulus as a cured resin and is useful as a stress relaxation material or shock absorption material.

The invention further provides a first metal-clad laminate comprising a composite resin layer that comprises a cured first prepreg of the invention, and a metal foil. The resin in the composite resin layer is cured to the C-stage state.

The invention further provides a second metal-clad laminate comprising a composite resin layer that comprises a cured second prepreg of the invention, and a metal foil. The resin in the composite resin layer is cured to the C-stage state.

Since the first metal-clad laminate of the invention is formed using a first prepreg of the invention, it can exhibit sufficient crack resistance upon folding. With this metal-clad laminate, it is possible to form a printed circuit board with desired foldability, and capable of being housed at high density in electronic device packages. The metal-clad laminate also has excellent adhesion with metal foils and fiber base materials, and excellent heat resistance.

Since the second metal-clad laminate of the invention is formed using a second prepreg of the invention, it can exhibit a sufficiently low elastic modulus and sufficient crack resistance upon folding. With this metal-clad laminate, it is possible to form a printed circuit board with desired foldability, and capable of being housed at high density in electronic device packages. The metal-clad laminate also has excellent adhesion with metal foils and fiber base materials, and excellent heat resistance. In addition, the metal-clad laminate has reduced stress between the metal foil or fiber base material and the resin composition during curing. Moreover, since the elastic modulus of the resin is low in the metal-clad laminate, it has excellent stress relaxation and shock absorption.

Advantageous Effects of Invention

According to the invention it is possible to provide a first resin composition with excellent moldability, that can form products with low reduction in cured elongation, the ability to fold without cracking when formed into printed circuit boards, and capable of being housed at high density in electronic device packages. According to the invention it is also possible to provide a prepreg using the resin composition, a metal foil with a resin, an adhesive film and a metal-clad laminate.

Furthermore, according to the invention it is possible to provide a second resin composition with excellent moldability, low reduction in cured elongation, satisfactory adhesion with copper foils, glass and polyimides used together as circuit board materials, and able to form cured products with a sufficiently low elastic modulus, and that can form products with the ability to fold without cracking when formed into printed circuit boards, and capable of being housed at high density in electronic device packages. According to the invention it is also possible to provide a prepreg using the resin composition, a metal foil with a resin, an adhesive film and a metal-clad laminate.

BRIEF DESCRIPTION OF DRAWINGS

FIG. 4 is a schematic cross-sectional view of an embodiment of a metal-clad laminate according to the invention.

DESCRIPTION OF EMBODIMENTS

Figure 1:
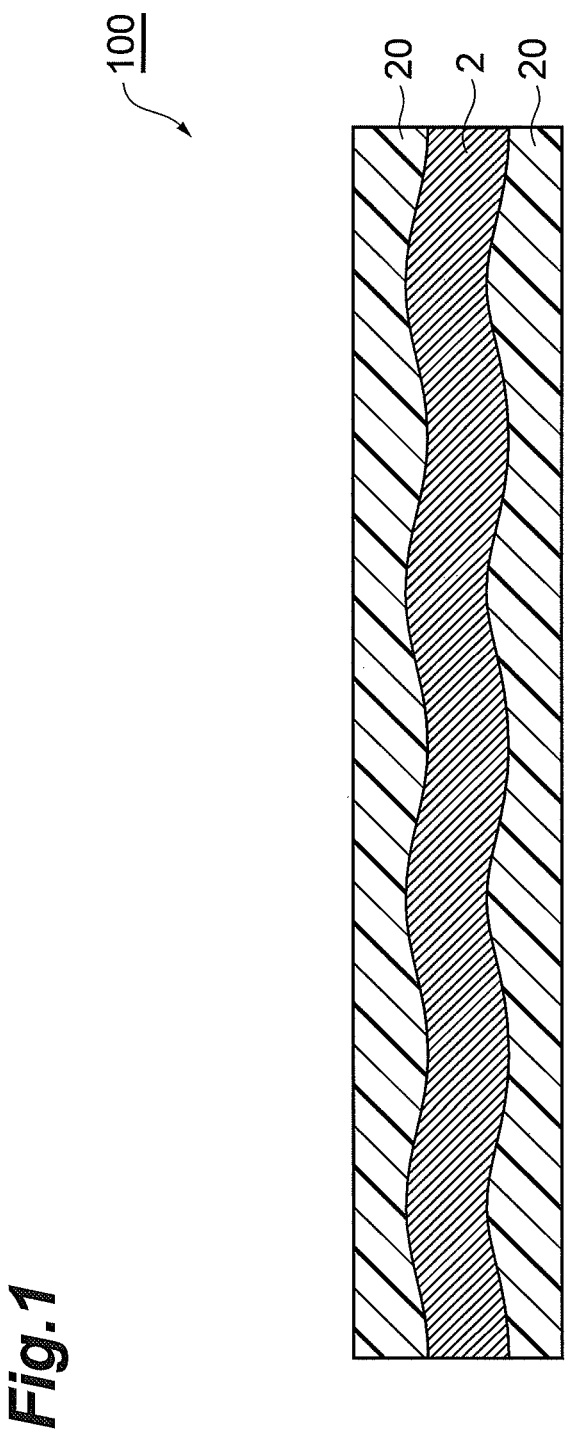
FIG. 1 is a schematic cross-sectional view showing an embodiment of a prepreg according to the invention.

Preferred embodiments of the invention will now be described in detail with reference to the accompanying drawings. However, the present invention is not limited to the embodiments described below. Throughout the explanation of the drawings, identical or corresponding elements will be referred to by like reference numerals and will be explained only once.

The resin composition according to the first embodiment comprises a polyamideimide and a polyfunctional glycidyl compound, the polyamideimide having 2 or more carboxyl groups on at least one end of the molecular chain. The resin composition has excellent moldability when worked into a B-stage state film or the like, is capable of hot molding, and has low reduction in elongation after thermosetting (C-stage state). According to the resin composition of this embodiment, it is possible to form a printed circuit board with desired foldability, and capable of being housed at high density in electronic device packages. The resin composition of this embodiment also has excellent adhesion with metal foils and fiber base materials, and excellent heat resistance, and is useful as a material for interlayer connection on a multilayer printed circuit board or a material for a printed circuit board such as a metal-clad laminate. In addition, since it has low reduction in cured elongation, the resin composition of this embodiment can be expected to alleviate stress produced between metal foils or fiber base materials and the resin composition during curing, when it is used as a material for a printed circuit board.

The resin composition according to the second embodiment is one wherein the polyamideimide has 2 or more carboxyl groups on at least one end of the molecular chain, and has a polysiloxaneimide structure in the molecular chain, the polysiloxaneimide structure having an unsaturated bond-containing group on a side chain. The resin composition has excellent moldability when worked into a B-stage state film or the like, is capable of hot molding, and has low reduction in elongation after thermosetting (C-stage state), while also forming cured products with a sufficiently low elastic modulus. According to the resin composition of this embodiment, it is possible to form a printed circuit board with desired foldability, and capable of being housed at high density in electronic device packages. The resin composition of this embodiment also has excellent adhesion with metal foils and fiber base materials, and excellent heat resistance, and is useful as a material for interlayer connection on a multilayer printed circuit board or a material for a printed circuit board such as a metal-clad laminate. In addition, since it has low reduction in cured elongation, the resin composition of this embodiment can alleviate stress produced between metal foils or fiber base materials and the resin composition during curing, when it is used as a material for a printed circuit board. In addition, the resin composition of this embodiment has a low elastic modulus as a cured resin and is useful as a stress relaxation material or shock absorption material. The resin composition of this embodiment can also exhibit satisfactory adhesion with copper foils, glass and polyimides that are used together as circuit board materials.

The unsaturated bond in the unsaturated bond-containing group is preferably a carbon-carbon unsaturated bond. If the unsaturated bond is of this type, the compatibility of each imide component in the polyamideimide will be increased and the compatibility between the polyamideimide and glycidyl compound will also be increased, resulting in a lower elastic modulus and further improved moldability when formed into a film.

The polyamideimide and polyfunctional glycidyl compound will now be described in greater detail.

[Polyamideimide]

The polyamideimide used is preferably a polyamideimide obtained by reaction between a dicarboxylic acid compound and a diisocyanate. Specifically, it is preferably a polyamideimide obtained by introducing 2 or more carboxyl groups into at least one end of a reaction product obtained by reacting 1.05-1.45 mol of diisocyanate with 1 mol of dicarboxylic acid.

If the dicarboxylic acid compound used contains a polysiloxane structure with an unsaturated bond-containing group on a side chain, for example, it is possible to prepare a polyamideimide comprising a siloxaneimide structure with an unsaturated bond-containing group on the side chain. The method of preparing the dicarboxylic acid compound with an unsaturated bond-containing group on the side chain will be described below.

By reacting an excess of a diisocyanate with a dicarboxylic acid compound in this manner, it is possible to produce a polyamideimide wherein the molecular chain ends are isocyanate groups. Also by reacting, for example, a prescribed amount of a compound having 3 or more non-cyclizing carboxyl groups with a polyamideimide wherein the molecular chain ends are isocyanate groups, it is possible to react only one of the carboxyl groups with the isocyanate. This will allow 2 or more carboxyl groups to remain. A polyamideimide with 2 or more carboxyl groups on at least one end of the molecular chain can thus be prepared. For reaction between a polyamideimide wherein the molecular chain ends are isocyanate groups and a compound with 3 or more non-cyclizing carboxyl groups, it is possible to inhibit gelling by selection of the compound weight ratios. A non-cyclizing carboxyl group is one that does not undergo dehydrating cyclization under reaction temperature conditions of 100° C. or higher. For example, with a compound in which 3 carboxyl groups are bonded to an aromatic ring or fused ring, the positional relationship of the two nearest carboxyl groups means the positional relationship in which the carbon atoms on which the carboxyl groups are bonded are separated by at least one carbon atom. Using such a compound is preferred as it will leave the carboxyl groups separate and will prevent cyclization and imide formation.

A compound with 3 or more non-cyclizing carboxyl groups is preferably an aromatic polybasic acid, and it is preferably one that does not undergo dehydrating cyclization by heat. If the compound with 3 or more non-cyclizing carboxyl groups is an aromatic polybasic acid, at least one of the molecular chains of the polyamideimide may be an aromatic amide group with 2 or more carboxyl groups. This can increase the heat resistance and hydrolysis resistance of the resin composition, and when the resin composition has been thermoset, will yield a cured product that can form a film without a support. Examples of such aromatic polybasic acids include aromatic tricarboxylic acids such as 1,3,5-benzenetricarboxylic acid (trimesic acid), 1,3,5-naphthalenetricarboxylic acid, 1,3,7-naphthalenetricarboxylic acid and 1,5,7-naphthalenetricarboxylic acid. Particularly preferred among these is 1,3,5-benzenetricarboxylic acid (trimesic acid), for its ready availability, and from the viewpoint of moldability of the polyamideimide.

A polyamideimide having 2 or more carboxyl groups on one end of the molecule can also be prepared by reacting prescribed amounts of a polyamideimide wherein the molecular chain ends are isocyanate groups, and a compound with 2 or more non-cyclizing carboxyl groups or hydroxyl groups. The compound with 2 or more non-cyclizing carboxyl groups or hydroxyl groups may be a phenolic hydroxyl-containing aromatic polybasic acid such as hydroxyisophthalic acid or 2-hydroxy-3,6-carboxynaphthalene.

The hydroxyl groups in a phenolic hydroxyl-containing aromatic polybasic acid are preferred since they react more readily than carboxyl groups with isocyanates, and therefore allow the reaction to take place at lower temperature.

An amide bond is produced by reaction between an aromatic carboxyl group, where the carboxyl group is bonded to an aromatic ring, and an isocyanate, while a urethane bond is produced by reaction between a phenolic hydroxyl group and an isocyanate. Due to these differences in reactivity, using an aromatic polybasic acid with 1 or more hydroxyl groups and 2 or more carboxyl groups, for example, can produce a polyamideimide wherein 2 or more aromatic carboxyl groups remain through urethane bonds at the molecular chain ends. Aromatic polybasic acids with 1 or more hydroxyl groups and 2 or more carboxyl groups include hydroxyisophthalic acid and 2-hydroxy-3,6-carboxynaphthalene. However, polyamideimides bonded through urethane bonds may have inferior heat resistance and hygroscopicity compared to polyamideimides bonded through amide bonds.

When a non-cyclizing aromatic tricarboxylic acid has been used, the aromatic polybasic acid is preferably added in a 0.3-1.2 fold amount and more preferably in a 0.5-1.0 fold amount with respect to the amount calculated as "2×A×MW/Mn", based on the molecular weight (MW) of the non-cyclizing aromatic tricarboxylic acid, the weight (A) of the polyamideimide wherein the molecular chain ends are isocyanate groups, and the number-average molecular weight Mn of the polyamideimide. If this amount is less than 0.3, the effect of the introduction of the 2 or more carboxyl groups into the molecular ends of the polyamideimide will tend to be reduced, and when the resin composition is made into a varnish, microgelling may occur in the varnish. If the amount exceeds 1.2, the unreacted non-cyclizing aromatic tricarboxylic acid will be deposited in the varnish, often lowering the film properties, and therefore a filtration step will be necessary to filter the unreacted non-cyclizing aromatic tricarboxylic acid.

The number-average molecular weight of the polyamideimide having 2 or more carboxyl groups on at least one end of the molecular chain is preferably 10,000-40,000, more preferably 15,000-30,000 and even more preferably 18,000-25,000. If the number-average molecular weight is greater than 40,000, the moldability when formed into a film will tend to be inadequate, while if it is less than 10,000, film formation will become difficult and the strength of the film after thermosetting will tend to be insufficient.

The number-average molecular weight of the polyamideimide of the invention may be determined by calculation using standard polystyrene, from a chromatogram of the molecular weight distribution measured (at 25° C.) by GPC (gel permeation chromatography).

The reaction temperature for a polyamideimide wherein the molecular chain ends are isocyanate groups and an aromatic polybasic acid is preferably 140-190° C. and more preferably 160-180° C.

The dicarboxylic acid and diisocyanate used for production of a polyamideimide wherein the molecular chain ends are isocyanate groups will now be described in detail.

The dicarboxylic acid compound is preferably a diimidedicarboxylic acid obtained by reacting a diamine and trimellitic anhydride. By selecting the structure of the diamine used for the reaction, it is possible to control the flexibility, heat resistance and strength of the polyamideimide.

Examples of such diamines include aliphatic diamines, aromatic diamines, and their mixtures.

Examples of aliphatic diamines include straight-chain aliphatic diamines such as hexamethylenediamine, octamethylenediamine, decamethylenediamine, dodecamethylenediamine and octadecamethylenediamine, and terminal aminated polypropylene glycols. Aliphatic diamines preferably contain ether groups from the viewpoint of both low elastic modulus and high Tg, with terminal aminated polypropylene glycols being preferred. Available terminal aminated polypropylene glycols include JEFFAMINE D-230, D-400, D-2000 and D-4000 (product names of Huntsman), which have different molecular weights.

Examples of aromatic diamines include 2,2-bis[4-(4-aminophenoxy)phenyl]propane (BAPP), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)biphenyl, bis[4-(4-aminophenoxy)phenyl]ether, bis[4-(4-aminophenoxy)phenyl]ketone, 1,3-bis(4-aminophenoxy)benzene, 1,4-bis(4-aminophenoxy)benzene, 2,2'-dimethylbiphenyl-4,4'-diamine, 2,2'-bis(trifluoromethyl)biphenyl-4,4'-diamine, 2,6,2',6'-tetramethyl-4,4'-diamine, 5,5'-dimethyl-2,2'-sulfonylbiphenyl-4,4'-diamine, 3,3'-dihydroxybiphenyl-4,4'-diamine, (4,4'-diamino)diphenyl ether, (4,4'-diamino)diphenylsulfone, (4,4'-diamino)benzophenone, (3,3'-diamino)benzophenone, (4,4'-diamino)diphenylmethane, (4,4'-diamino)diphenyl ether and (3,3'-diamino)diphenyl ether.

The diamine preferably includes a diamine with the organopolysiloxane structure represented by formula (1) below. By adding a diamine with an organopolysiloxane structure to the diamine, it is possible to add an organopolysiloxane structure to the polyamideimide having 2 or more carboxyl groups on at least one end of the molecular chain. If the polyamideimide comprises an organopolysiloxane structure, the flexibility of the polyamideimide will be increased. In addition, when the resin composition is formed into a film, the film drying property will be increased and it will be easier to lower the volatile components of the film, while the elastic modulus of the film can also be reduced.

[Chemical Formula 1]

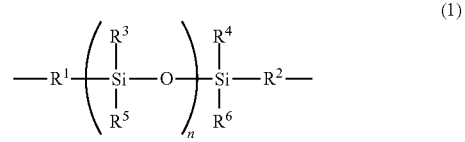

(1)

In formula (1), $R^1$ and $R^2$ each independently represent a divalent organic group, $R^3$, $R^4$, $R^5$ and $R^6$ each independently represent a monovalent organic group, and n represents an integer of 1 or greater. When multiple $R^3$ and $R^5$ groups are present, the $R^3$ and $R^5$ groups may be different from each other.

Preferred divalent organic groups are alkylene and phenylene or substituted phenylene groups. The number of carbon atoms of the divalent organic groups is preferably 1-6. C1-3 alkylene groups are more preferred as the divalent organic groups.

Preferred monovalent organic groups are alkyl and phenyl or substituted phenyl groups. The number of carbon atoms of the monovalent organic groups is preferably 1-6. C1-3 alkyl groups are more preferred as the monovalent organic groups.

The letter n is preferably an integer of 1-50.

Most preferably for this embodiment, $R^1$ and $R^2$ are both propylene groups and $R^3$, $R^4$, $R^5$ and $R^6$ are all methyl groups.

Examples for the diamine with an organopolysiloxane structure represented by formula (1) include siloxanediamines represented by the following formulas (3) and (4).

[Chemical Formula 2]

$$H_2NCH_2CH_2CH_2-\left(\begin{array}{c}CH_3\\|\\Si-O\\|\\CH_3\end{array}\right)_n\begin{array}{c}CH_3\\|\\Si-CH_2CH_2CH_2NH_2\\|\\CH_3\end{array} \quad (3)$$

[Chemical Formula 3]

$$H_2NH_2CH_2CH_2C-\left(\begin{array}{c}C_6H_5\\|\\Si-O\\|\\C_6H_5\end{array}\right)_m\left(\begin{array}{c}CH_3\\|\\Si-O\\|\\CH_3\end{array}\right)_q\begin{array}{c}CH_3\\|\\Si-CH_2CH_2CH_2NH_2\\|\\CH_3\end{array} \quad (4)$$

The letter n in formula (3) has the same definition as above. In formula (4), preferably m represents an integer of 1 or greater, q represents an integer of 0 or greater, and m+q is 1-50.

Examples of siloxanediamines represented by formula (3) include X-22-161AS (current name: KF8010) (amine equivalents: 450), X-22-161A (amine equivalents: 840), X-22-161B (amine equivalents: 1500) (all product names of Shin-Etsu Chemical Co., Ltd.), BY16-853 (amine equivalents: 650) and BY16-853B (amine equivalents: 2200) (both product names of Toray Dow Corning Silicone Co., Ltd.). Examples of siloxanediamines represented by formula (4) include X-22-9409 (amine equivalents: 700) and X-22-1660B-3 (amine equivalents: 2200) (product names of Shin-Etsu Chemical Co., Ltd.).

The main chain of the polyamideimide may include an alkylene and/or oxyalkylene group in addition to the organopolysiloxane structure. That is, the main chain of the polyamideimide may contain the following (I), (II) and (III).
(I) An organopolysiloxane structure and an alkylene group.
(II) An organopolysiloxane structure and an oxyalkylene group.
(III) An organopolysiloxane structure, an alkylene group and an oxyalkylene group.

The alkylene groups of (I) and (III) are preferably straight-chain or branched alkylene groups, and the number of carbon atoms of each alkylene group is preferably 1-12. The number of carbon atoms of the oxyalkylene groups of (II) and (III) are preferably 1-6 and more preferably 2-4. Also, 2 or more oxyalkylene groups may be repeated to form a polyoxyalkylene structure.

A polyamideimide containing (I), (II) and (III) above can be produced, for example, using a diamine with an alkylene and/or oxyalkylene group and a diamine with an organopolysiloxane structure, as the diamine.

Examples of diamines containing alkylene and/or oxyalkylene groups include low molecular diamines such as hexamethylenediamine, nonamethylenediamine and diaminodiethyl ether, and both-terminal aminated oligomers or both-terminal aminated polymers such as both-terminal aminated polyethylene and both-terminal aminated polypropylene. The number of carbon atoms of the alkylene group in a diamine with an alkylene group is preferably at least 4, and more preferably 6-18. For this embodiment it is most preferred to use a diamine with an alkylene group and an oxyalkylene group. Such diamines include diamines of the following formulas (6a), (6b), (6c) and (6d).

[Chemical Formula 4]

$$H_2N-\underset{\underset{CH_3}{|}}{C}HCH_2-(OCH_2-\underset{\underset{CH_3}{|}}{C}H)_a-NH_2 \quad (6a)$$

In formula (6a), a represents an integer of 2-70.

[Chemical Formula 5]

$$H_2N-\underset{\underset{CH_3}{|}}{C}HCH_2-(OCH_2-\underset{\underset{CH_3}{|}}{C}H)_b-(OCH_2-CH_2)_c-(OCH_2-\underset{\underset{CH_3}{|}}{C}H)_d-NH_2 \quad (6b)$$

In formula (6b), b, c and d each represent an integer of 1 or greater. The sum of b+c+d is preferably 5-40.

[Chemical Formula 6]

$$H_2N-\underset{\underset{CH_3}{|}}{C}HCH_2OCH_2CH_2OCH_2CH_2OCH_2-\underset{\underset{CH_3}{|}}{C}H-NH_2 \quad (6c)$$

[Chemical Formula 7]

$$H_2N-CH_2CH_2OCH_2CH_2OCH_2CH_2-NH_2 \quad (6d)$$

Diamines of formulas (6a), (6b), (6c) and (6d) include the JEFFAMINE D Series such as JEFFAMINE D2000, JEFFAMINE D230, JEFFAMINE D400 and JEFFAMINE D4000, the JEFFAMINE ED Series such as JEFFAMINE ED600, JEFFAMINE ED900 and JEFFAMINE ED2003, JEFFAMINE XTJ-511, and JEFFAMINE XTJ-512 (all product names of Huntsman Corp.).

The molecular weight of a diamine with an alkylene and/or oxyalkylene group is preferably 30-20,000, more preferably 50-5000 and even more preferably 100-3000. If the molecular weight of the diamine with an alkylene and/or oxyalkylene group is within this range, it will be possible to effectively reduce wrinkling and warping after drying, after impregnation into the obtained fiber base material. Of those mentioned above, JEFFAMINE is most preferred because it has a suitable molecular weight, and results in an excellent elastic modulus and permittivity for the obtained polyamideimide.

The main chain of the polyamideimide most preferably contains a structure of (III) above. In this case, the alkylene and oxyalkylene groups most preferably have one or more structures from among the following formulas (4a), (4b), (4c) and (4d).

[Chemical Formula 8]

$$-\underset{\underset{CH_3}{|}}{C}HCH_2-(OCH_2-\underset{\underset{CH_3}{|}}{C}H)_{\overline{a}} \quad (4a)$$

In formula (4a), "a" has the same definition as in formula (6a).

[Chemical Formula 9]

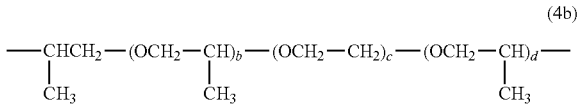

(4b)

In formula (4b), b, c and d have the same definitions as in formula (6b).

[Chemical Formula 10]

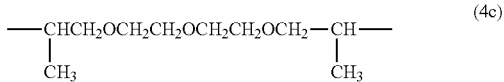

(4c)

[Chemical Formula 11]

(4d)

The polyamideimide in the resin composition of the second embodiment (a polyamideimide comprising a polysiloxaneimide structure having an unsaturated bond-containing group on a side chain) may be produced, for example, using as the dicarboxylic acid compound one comprising a polysiloxane structure with an unsaturated bond-containing group on a side chain. A dicarboxylic acid compound with an unsaturated bond-containing group on a side chain may be produced, for example, using as the aliphatic diamine, a diamine comprising a polysiloxane structure with an unsaturated bond-containing group on a side chain. Examples of unsaturated bond-containing groups include vinyl and phenyl.

Examples of diamines comprising polysiloxane structures with unsaturated bond-containing groups on side chains include polysiloxanediamines containing silicon with a vinyl group bonded thereto. Examples of such polysiloxanediamines include diamines represented by the following formula (1a).

[Chemical Formula 12]

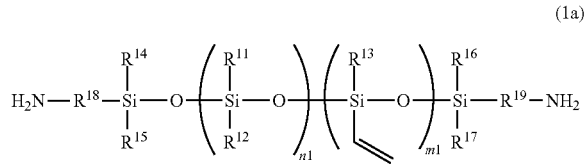

(1a)

In formula (1a), $R^{11}$, $R^{12}$, $R^{13}$, $R^{14}$, $R^{15}$, $R^{16}$ and $R^{17}$ each represent $CH_3$, $C_2H_5$ or $C_3H_7$. The $R^{11}$, $R^{12}$, $R^{13}$, $R^{14}$, $R^{15}$, $R^{16}$ and $R^{17}$ groups may be the same or different. $R^{18}$ and $R^{19}$ each represent a divalent organic group. $R^{18}$ and $R^{19}$ are preferably C1-3 saturated hydrocarbon groups. Also, n1 is an integer of 0 or greater and m1 is an integer of 1 or greater, the sum of n1+m1 being 1-50.

A polysiloxanediamine represented by formula (1a) is commercially available as X-22-9412 (product name of Shin-Etsu Chemical Co., Ltd.).

When the diamine includes a diamine represented by formula (1a), it is preferably used at 30-70 parts by weight, more preferably 35-65 parts by weight and even more preferably 40-60 parts by weight with respect to 100 parts by weight of the total diamine used.

Examples of polysiloxanediamines containing silicon with a phenyl group bonded as an unsaturated bond include X-22-9409 and X-22-1660-B3 (both product names of Shin-Etsu Chemical Co., Ltd.).

By using a mixture of a diamine comprising a polysiloxane structure with an unsaturated bond-containing group on a side chain as the diamine, and a terminal aminated polypropylene glycol, it is possible to produce a dicarboxylic acid compound having a polysiloxane structure with an unsaturated bond-containing group on a side chain, and a polyoxypropylene structure. That is, using such a compound as the diamine can produce, as a result, a polyamideimide having a polysiloxaneimide structure with an unsaturated bond-containing group on a side chain, and a polyoxypropyleneimide structure. By using such a polyamideimide, the resin composition will have an even lower elastic modulus and increased elongation.

In this case, the terminal aminated polypropylene glycol is preferably used at 70-130 parts by weight, more preferably 80-120 parts by weight and even more preferably 90-110 parts by weight with respect to 100 parts by weight of the diamine comprising the polysiloxane structure with an unsaturated bond-containing group on a side chain.

In the step of producing a diimidedicarboxylic acid from a diamine and trimellitic anhydride, it is preferred to use an aprotic polar solvent as the solvent. Aprotic polar solvents include dimethylacetamide, dimethylformamide, dimethyl sulfoxide, N-methyl-2-pyrrolidone, 4-butyrolactone and sulfolane. Because the step of producing a diimidedicarboxylic acid requires a high reaction temperature, it is most preferred to use N-methyl-2-pyrrolidone, which has a high boiling point, and satisfactory solubility for the starting materials and the obtained polymer.

The combined weight of the diamine and trimellitic anhydride preferably corresponds to 10-70 wt % with respect to the weight of the solvent. If it is less than 10 wt % the efficiency will be poor due to the large consumption of solvent, while if it is greater than 70 wt % the diamine and trimellitic anhydride will not thoroughly dissolve and it may be difficult for adequate reaction to be accomplished.

The trimellitic anhydride is preferably used in a molar amount of 2.00-2.20 with respect to the total number of moles of the diamine. By using the trimellitic anhydride in a molar amount of 2.00-2.20 times that of the amine mixture, it is possible to obtain a high yield of reaction product (diimidedicarboxylic acid) more reliably having carboxyl groups at both ends. As a result, it is possible to increase the reactive sites with the diisocyanate to more easily obtain a high molecular weight polyamideimide, and the mechanical strength of the obtained polyamideimide can also be further increased.

The reaction temperature for reaction between the diamine and trimellitic anhydride is preferably 50-150° C. and more preferably 50-90° C. At a temperature of lower than 50° C. the reaction will be slowed, which tends to be industrially disadvantageous, while at a temperature of higher than 150° C., reaction with the non-cyclizing carboxyl groups will proceed, tending to inhibit the imide-producing reaction.

In the step of producing a diimidedicarboxylic acid, it is believed that reaction between the diamine and trimellitic anhydride causes the anhydrous portion of the trimellitic anhydride to undergo ring opening and then dehydrating cyclization, forming an imide bond. This dehydrating ring closure reaction is preferably carried out at the end of the diimidedicarboxylic acid-producing step, by adding an aromatic hydrocarbon that is azeotropic with water to the obtained reaction mixture to increase the temperature. By adding an aromatic hydrocarbon that is azeotropic with water to the reaction mixture, it is possible to efficiently remove the water produced by the dehydrating ring closure reaction.

The dehydrating ring closure reaction is preferably conducted until water is no longer generated. Completion of the dehydrating ring closure reaction can be determined, for example, by confirming that a stoichiometric amount of water has distilled off, using a water measuring receptacle or the like.

Examples of aromatic hydrocarbons that are azeotropic with water include benzene, xylene, ethylbenzene and toluene. Toluene is preferred because of its low boiling point, making it easy to distill off, and for its relatively low toxicity.

An aromatic hydrocarbon that is azeotropic with water is preferably added in an amount corresponding to 10-50 wt % with respect to the weight of the aprotic polar solvent. If the amount of the aromatic hydrocarbon that is azeotropic with water is less than 10 wt % with respect to the amount of the aprotic polar solvent, the effect of removing water will tend to be reduced, while if it is 50 wt % or greater, the diimidedicarboxylic acid product will tend to precipitate.

The dehydrating ring closure reaction is preferably conducted at a reaction temperature of 120-180° C. The water may not be thoroughly removed at temperatures lower than 120° C., while it may not be possible to prevent dissipation of the aromatic hydrocarbon at temperatures higher than 180° C.

The aromatic hydrocarbon that is azeotropic with water is preferably removed before reaction of the diimidedicarboxylic acid with the diisocyanate. While it contains the aromatic hydrocarbon, the polyamideimide product, which has isocyanate groups at the molecular chain ends, may precipitate during the reaction. There are no particular restrictions on the method of removing the aromatic hydrocarbon, but as an example there may be mentioned a method of distilling off the aromatic hydrocarbon by further raising the temperature after the dehydrating ring closure reaction.

Examples for the diisocyanate to be reacted with the diimidedicarboxylic acid include aromatic diisocyanates such as 4,4'-diphenylmethane diisocyanate (hereunder abbreviated as MDI), 2,4-tolylene diisocyanate, 2,6-tolylene diisocyanate, naphthalene-1,5-diisocyanate, o-xylylene diisocyanate, m-xylylene diisocyanate and 2,4-tolylene dimer, and aliphatic diisocyanates such as hexamethylene diisocyanate, 4,4-methylenebis(cyclohexyl isocyanate) and isophorone diisocyanate. From the viewpoint of improving the heat resistance of the polyamideimide, an aromatic diisocyanate is preferred.

The diisocyanate is preferably used in a molar ratio of 1.05-1.45 with respect to the total number of moles of the diimidedicarboxylic acid. By using the diisocyanate in this range, it is possible to obtain a molecular weight for the obtained polyamideimide which is in a range that allows melt molding. This can inhibit gelling in the subsequent reaction between the polyamideimide wherein the molecular chain ends are isocyanate groups, and the compound with 3 or more carboxyl groups, so that sufficient elongation can be obtained when the resin composition comprising the polyfunctional glycidyl compound is finally cured.

The following shows a both-terminal dicarboxylic acid-modified polyamideimide ($\gamma$), as a preferred embodiment of a polyamideimide to be included in the resin composition of the first embodiment, as well as a production scheme therefor.

[Chemical Formula 13]
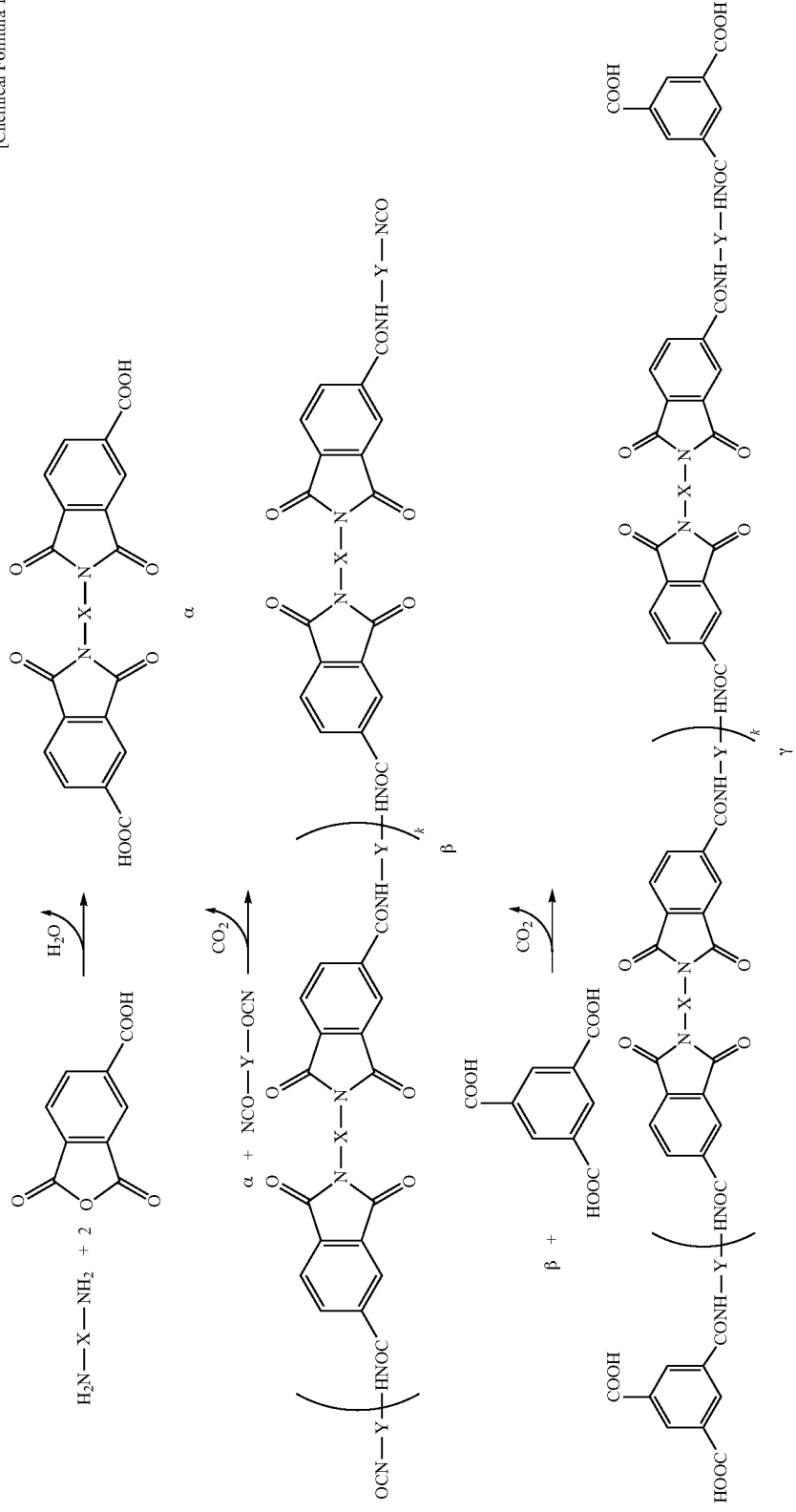

In this scheme, the diamine containing X may be selected from any of the diamines mentioned above. The diisocyanate containing Y may also be selected from any of the diisocyanates mentioned above. Also, k is an integer of 1 or greater. The value of k is preferably 10-80, more preferably 20-50 k and even more preferably 30-40. By this type of scheme it is possible to produce a both-terminal dicarboxylic acid-modified polyamideimide (γ) having aromatic amide groups with 2 or more carboxyl groups on both ends.

This method is preferred because the reaction can efficiently proceed without removing the reaction products, in all of the steps from reaction between the diamine and trimellitic anhydride to production of the polyamideimide of this embodiment.

Here, when the both-terminal dicarboxylic acid-modified polyamideimide (γ) is a both-terminal dicarboxylic acid-modified polyamideimide comprising a polysiloxaneimide structure with an unsaturated bond-containing group on a side chain, as a preferred embodiment of the polyamideimide to be included in the resin composition of the second embodiment, the diamine containing X is a diamine comprising a polysiloxane structure with an unsaturated bond-containing group on a side chain. By this type of scheme it is possible to produce a both-terminal dicarboxylic acid-modified polyamideimide having aromatic amide groups with 2 or more carboxyl groups on both ends, and comprising a polysiloxaneimide structure with an unsaturated bond-containing group on a side chain.

[Polyfunctional Glycidyl Compound]

In the first embodiment and second embodiment, the polyfunctional glycidyl compound in the resin composition is not particularly restricted so long as it is a glycidyl compound with 2 or more functional groups in the molecule, and it is preferably an epoxy resin with 2 or more glycidyl groups. Epoxy resins can be cured at temperatures of 180° C. and lower, and can react with the carboxyl groups of the polyamideimide to improve the thermal, mechanical and electrical properties.

Epoxy resins include polyglycidyl ethers obtained by reaction between epichlorohydrin and polyhydric phenols such as bisphenol A, novolac-type phenol resins and orthocresol-novolac-type phenol resins, or polyhydric alcohols such as 1,4-butanediol, polyglycidyl esters obtained by reaction between epichlorohydrin and polybasic acids such as phthalic acid or hexahydrophthalic acid, N-glycidyl derivatives of compounds with amine, amide or heterocyclic nitrogen groups, and alicyclic epoxy resins, fused ring-type epoxy resins, biphenyl-type epoxy resins, salicylaldehyde-novolac-type epoxy resins and phosphorus-containing epoxy resins. Specifically, these include EPICLON 153, EPICLON 840, EPICLON 840-S, EPICLON 850, EPICLON 850-S, EPICLON EXA-850CRP, EPICLON 850-LC, EPICLON 860, EPICLON 1050, EPICLON 1055, EPICLON 2050, EPICLON 3050, EPICLON 4050, LF-4711, LF-6161, LF-4871, LA-7052, LA-7054, LA-7751, LA-1356, LA-3018-50P, EPICLON N-673-80M, EPICLON N-680-75M, EPICLON N-690-75M, EPICLON N-740-80M, EPICLON N-770-70M, EPICLON N-865-80M, HP-4032 and HP-4032D (all product names of DIC Corp.), YD-127, YD-128, YD-127, YD-8125, YD-907, YDCN-700-2, YDCN-700-3, YDCN-700-5, YDCN-700-7, YDCN-700-10, YDCN-704 and YDPN-638 (all product names of Tohto Kasei Co., Ltd.), DER331 L and DER337 (both product names of The Dow Chemical Company), Ep152, Ep154, Ep815, Ep828, YX8800, YX4000, YX4000H, YL6121H, YL6640, YL6677, YX7399 and RXE15 (all product names of Japan Epoxy Resins Co., Ltd.), NC3000H, EPPN502H, ZX1548-2 and AK-601 (all product names of Nippon Kayaku Co., Ltd.), EX-212L and EX-214L (both product names of Nagase ChemteX Corp.), and CELLOXIDE 2021P (product name of Daicel Chemical Industries, Ltd.).

A greater number of glycidyl groups in the epoxy resin is preferred, with 3 or more being more preferred.

When the polyfunctional glycidyl compound is an epoxy resin with 2 or more glycidyl groups, the resin composition of this embodiment preferably comprises a curing agent for the epoxy resin. The suitable content for the curing agent will depend on the number of glycidyl groups. Specifically, the content may be lower with a greater number of glycidyl groups.

The curing agent is not particularly restricted so long as it reacts with the epoxy resin and promotes curing, and examples include amines, imidazoles, polyfunctional phenols and acid anhydrides.

Examples of amines include dicyandiamide, diaminodiphenylmethane and guanylurea.

Examples of imidazoles include alkyl group-substituted imidazoles and benzimidazoles.

Examples of polyfunctional phenols include hydroquinone, resorcinol, bisphenol A and their halogenated forms, as well as novolac-type phenol resins and resol-type phenol resins that are condensates with formaldehyde.

Examples of acid anhydrides include phthalic anhydride, benzophenonetetracarboxylic dianhydride and methylhymic acid.

Any of these curing agents may be used alone or in combinations of two or more.

The curing agent content is preferably an amount such that, when the curing agent is an amine, the active hydrogen equivalents of the amine are approximately equal to the epoxy equivalents of the epoxy resin. When an imidazole is employed as the curing agent, it is preferably used not in an equivalent ratio with the active hydrogen, but rather, based on experience, 0.001-10 parts by weight with respect to 100 parts by weight of the epoxy resin. For a polyfunctional phenol or acid anhydride, it is preferably used at 0.6-1.2 equivalents of phenolic hydroxyl or carboxyl groups to 1 equivalent of the epoxy resin. A lower curing agent content will tend to leave more uncured epoxy resin, and result in a lower Tg (glass transition temperature). A higher content will tend to leave more unreacted curing agent and result in lower insulation. The epoxy equivalents of the epoxy resin preferably also take into account reaction with the amide groups of the polyamideimide.

The resin composition of this embodiment may further comprise a portion of the aforementioned curing agent as a curing accelerator. The preferred content for use as a curing accelerator is the same as the content of the curing agent.

The content of the polyfunctional glycidyl compound in the resin composition of this embodiment is preferably 1-200 parts by weight, more preferably 3-100 parts by weight and even more preferably 5-40 parts by weight, with respect to 100 parts by weight of the polyamideimide with 2 or more carboxyl groups on at least one end of the molecular chain. If the content is less than 1 part by weight the solvent resistance will tend to be lower, while if the content is greater than 200 parts by weight the unreacted glycidyl compound will tend to lower the Tg and result in insufficient heat resistance, and the flexibility will tend to be reduced.

The resin composition of this embodiment may also comprise an added flame retardant for the purpose of improving the flame retardance, if necessary, with examples thereof including aluminum hydroxide HP360 (product name of Showa Denko K.K.), silica SO-E5 (product name of Admatechs), and phosphorus-containing fillers. Phosphorus-containing fillers include OP930 (product name of Clariant Japan, phosphorus content: 23.5 wt %), HCA-HQ (product name of Sanko Co., Ltd., phosphorus content: 9.6 wt %), and the melamine polyphosphates PMP-100 (phosphorus content: 13.8 wt %), PMP-200 (phosphorus content: 9.3 wt %) and PMP-300 (phosphorus content: 9.8 wt %) (all product names of Nissan Chemical Industries, Ltd.).

The resin composition of the first embodiment has excellent moldability, but also low reduction in cured elongation and excellent adhesion with metal foils or fiber base materials, and excellent heat resistance. The present inventors believe that the reason for this effect is as follows.

In a conventional resin composition comprising a polyamideimide and a polyfunctional glycidyl compound, the amide groups in the polyamideimide serve as crosslinking points. Therefore, the resin in the C-stage state after heat curing has tended to have increased crosslink density. In contrast, with a polyamideimide having 2 or more carboxyl groups on at least one end of the molecular chain, as according to the invention, the glycidyl groups react with the carboxyl groups preferentially over the amide groups, and during thermosetting, chain extension and crosslinking take place preferentially at the ends of the polyamideimide, thus preventing formation of crosslinking points by the amide groups. The present inventors conjecture that this allows sufficient crosslinking to be accomplished in the resin as a whole while maintaining a low crosslink density of the soft components, making it possible to achieve elongation, adhesion and heat resistance.

This function and effect will now be explained with the specific example of reaction (i), as an illustration of a reaction wherein the polyamideimide is a both-terminal dicarboxylic acid-modified polyamideimide and the polyfunctional glycidyl compound is an epoxy resin (hereunder also abbreviated as "EP").

The resin composition of the second embodiment has excellent moldability, but also low reduction in cured elongation and excellent adhesion with metal foils or fiber base materials, and excellent heat resistance. In addition, the resin composition of this embodiment has a low elastic modulus as a cured resin and is useful as a stress relaxation material or shock absorption material. The present inventors believe that the reason for this effect is as follows.

In a conventional resin composition comprising a polyamideimide and a polyfunctional glycidyl compound, the amide groups in the polyamideimide serve as crosslinking points. Therefore, the resin in the C-stage state after heat curing has tended to have increased crosslink density. In contrast, with a polyamideimide according to this embodiment, the glycidyl groups react with the carboxyl groups preferentially over the amide groups, and during thermosetting, chain extension and crosslinking take place preferentially at the ends of the polyamideimide, thus preventing formation of crosslinking points by the amide groups. It is conjectured that this allows sufficient crosslinking to be accomplished in the resin as a whole while maintaining a low crosslink density of the soft components, making it possible to achieve elongation, adhesion and heat resistance. In addition, the unsaturated bond-containing groups on the side chains improve compatibility of the polyamideimide for polyfunctional glycidyl compounds such as epoxy resins and curing agents such as phenol resins, thereby helping to prevent reaction between polyfunctional glycidyl compounds or reaction between the polyfunctional glycidyl compound and the curing agent to occur preferentially over reaction between the polyfunctional glycidyl compound and the polyamideimide, and allowing the elastic modulus of the cured resin to be lowered. This conjecture is based on the knowledge of the

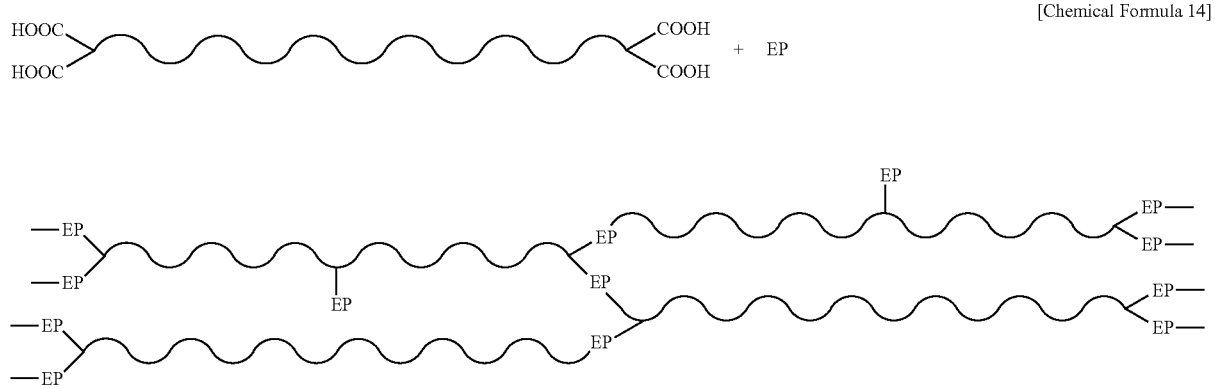

Reaction (i)

[Chemical Formula 14]

In reaction (i), the reaction is illustrated with the polyamideimide as a both-terminal dicarboxylic acid-modified polyamideimide, but even if the polyamideimide has only one end modified with a dicarboxylic acid, the polyfunctional glycidyl compound can react with the carboxyl or isocyanate groups at the ends of the molecular chains of the polyamideimide to produce chain extension and crosslinking, and thereby exhibit the same effect.

present inventors that unsaturated bond-containing groups remain without reacting during thermosetting.

This function and effect will now be explained with the specific example of reaction (ii), as illustration of a reaction wherein the polyamideimide is a both-terminal dicarboxylic acid-modified polyamideimide comprising a polysiloxane-imide structure with unsaturated bond-containing groups on the side chains, and the polyfunctional glycidyl compound is an epoxy resin (hereunder also abbreviated as "EP").

Reaction (ii)

[Chemical Formula 15]

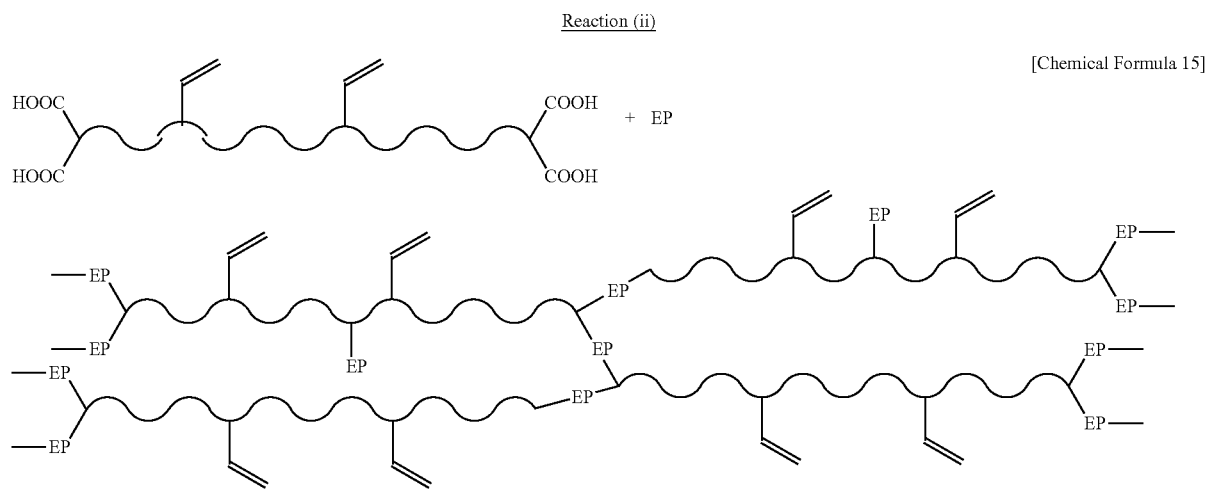

In reaction (ii), the reaction is illustrated with the polyamideimide as a both-terminal dicarboxylic acid-modified polyamideimide, but even if the polyamideimide has only one end modified with a carboxylic acid, the polyfunctional glycidyl compound can react with the carboxyl or isocyanate groups at the ends of the molecular chains of the polyamideimide to produce chain extension and crosslinking, and thereby exhibit the same effect.

Preferred embodiments of the resin composition of the invention were described above, and the resin composition can be used, for example, in prepregs, metal foils with resins, adhesive films and metal-clad laminates.

A prepreg, metal foil with a resin, adhesive film or metal-clad laminate employing the resin composition of the first embodiment, comprising a resin composition of the first embodiment, can exhibit excellent moldability, and adequate elongation even after thermosetting. This also allows formation of a printed circuit board that is freely foldable and can be housed at high density in an electronic device package, and is useful as a material for a printed circuit board with excellent adhesion with metal foils or fiber base materials, and excellent heat resistance. A prepreg, a metal foil with a resin, an adhesive film and a metal-clad laminate will now be described.

A prepreg, a metal foil with a resin, an adhesive film and a metal-clad laminate employing the resin composition of the second embodiment, which comprises a resin composition of the second embodiment, can exhibit excellent moldability, low reduction in elongation after thermosetting, and a sufficiently low elastic modulus after thermosetting. This also allows formation of a printed circuit board that is freely foldable and can be housed at high density in an electronic device package, and is useful as a material for a printed circuit board with excellent adhesion with metal foils or fiber base materials, and excellent heat resistance.

A prepreg, a metal foil with a resin, an adhesive film and a metal-clad laminate will now be described.

[Prepreg]

FIG. 1 is a schematic cross-sectional view showing an embodiment of a prepreg according to the invention. The prepreg 100 shown in FIG. 1 comprises a resin layer 20 in the B-stage state, formed from a resin composition, and a base material 2 embedded in the resin layer 20. The prepreg has excellent adhesion between the resin layer 20 and the base material 2.

The base material 2 is not particularly restricted so long as it is one used for production of metal-clad laminates or multilayer printed circuit boards, and for most purposes a fiber base material such as a woven fabric or nonwoven fabric may be used. The material of the fiber base material may be inorganic fiber such as glass, alumina, boron, silica/alumina-glass, silica-glass, tyranno, silicon carbide, silicon nitride or zirconia, organic fiber such as aramid, polyetheretherketone, polyetherimide, polyethersulfone, carbon or cellulose, or a mixed fiber sheet of the foregoing, with a glass fiber woven fabric being especially preferred. A glass cloth with a thickness of no greater than 50 μm is especially preferred as a base material to be used in a prepreg. If the base material 2 is a glass cloth with a thickness of no greater than 50 μm, it will be possible to fabricate a printed circuit board with excellent bendability, which undergoes minimal dimensional change with the temperature and humidity of the production process. Specific examples of glass cloths include WEX-1017, WEX-1027, WEX-1037 and WEX-1086 (all product names of Asahi Kasei E-Materials Corp.).

The prepreg 100 may be obtained, for example, by impregnating the base material 2 with the resin composition.

Specifically, a prepreg can be produced, for example, by preparing a varnish by mixing, dissolving and dispersing the aforementioned resin composition in an organic solvent, and then impregnating the base material 2 with the varnish and drying it. The organic solvent used for the varnish is not particularly restricted so long as it is able to dissolve or disperse the resin composition, and as examples there may be mentioned dimethylacetamide, dimethylformamide, dimethyl sulfoxide, N-methyl-2-pyrrolidone, γ-butyrolactone, sulfolane and cyclohexanone.

The drying is preferably accomplished at a temperature such that the volatilization rate of the organic solvent in the varnish is high and curing reaction of the resin composition is not accelerated. Usually, this temperature is preferably in the range of 80° C.-180° C. and more preferably no higher than 150° C. The drying time is preferably adjusted as appropriate for balance with the gelling time of the varnish. The drying is accomplished to preferably at least 80 wt % volatilization, more preferably at least 90 wt % volatilization and even more preferably at least 95 wt % volatilization of the solvent used in the varnish.

The impregnation amount of the varnish in the base material 2 is preferably an amount such that the solid weight ratio of the varnish is 30-80 wt % with respect to the total of the varnish solid content and the base material 2.

The thickness of the resin layer 20 (the thickness of the resin layer between the surface of the prepreg 100 and the surface of the base material 2) is preferably 3-25 μm and more preferably 5-15 μm. At less than 3 μm, flow of the resin will cause the weave texture of the fiber base material to easily emerge at the bonding interface with the metal foil during fabrication of a metal-clad laminate, thus tending to lower the bonding strength reliability. At greater than 25 μm, the bending property will tend to be impaired. The thickness of the resin layer 20 can be measured by observing a cross-section of the metal-clad laminate with an electron microscope or metallographic microscope, for example. A cross-section of the prepreg 100 is photographed, and the normal from a straight line connecting a height facing the prepreg surface of the base material 2 and an adjacent height facing the prepreg surface of the base material 2 is drawn down toward the prepreg surface in the photograph. The distance between the intersection of the normal with the prepreg surface and its intersection with the straight line connecting the heights is measured. The measurement is performed at 5 locations, and the average value may be recorded as the thickness of the resin layer 20.

The thickness of the prepreg 100 is preferably 15-120 μm and more preferably 15-50 μm. It is preferably 15 μm or greater from the viewpoint of ready availability of the fiber base material. If it exceeds 120 μm, impregnation or coating of the resin on the fiber base material will be difficult.

[Metal Foil with a Resin]

Figure 2:
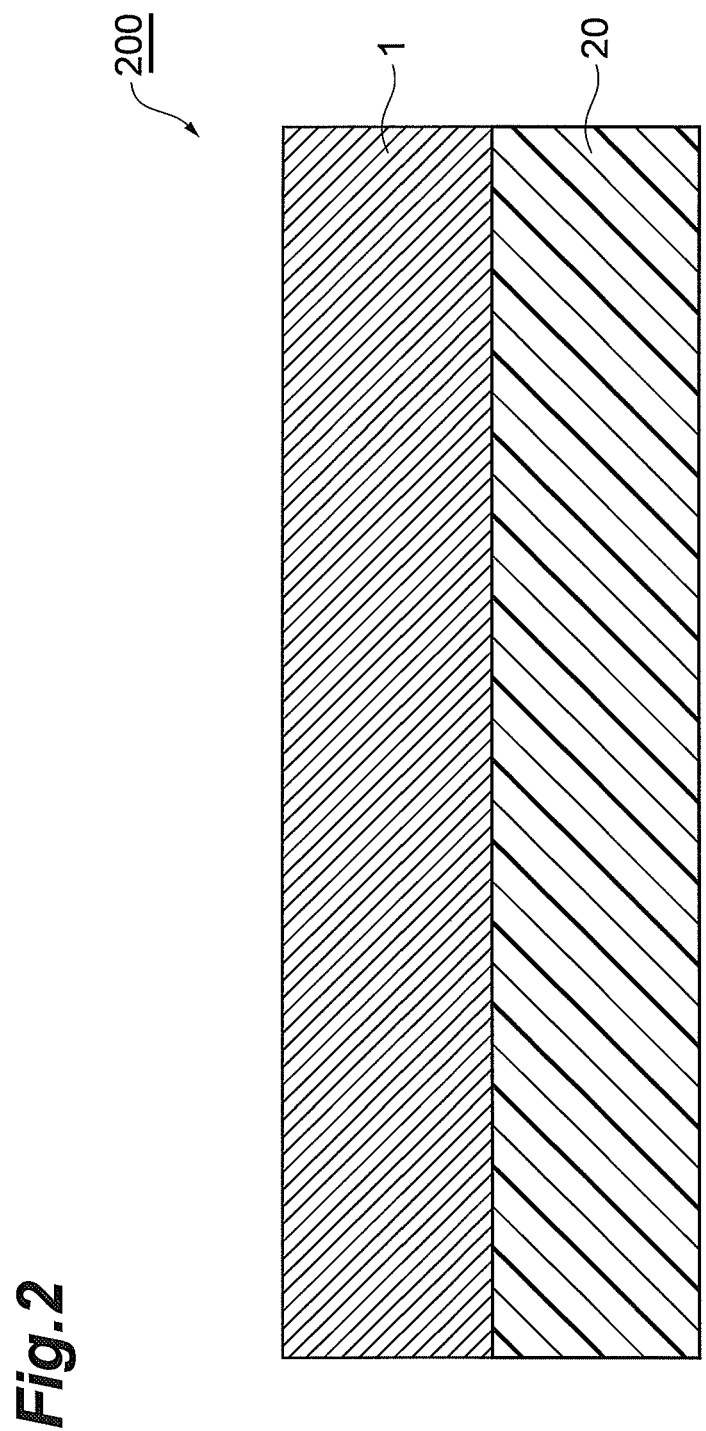
FIG. 2 is a schematic cross-sectional view showing an embodiment of a metal foil with a resin, according to the invention.

FIG. 2 is a schematic cross-sectional view showing an embodiment of a metal foil with a resin, according to the invention. The metal foil with a resin 200 shown in FIG. 2 comprises a resin layer 20 in the B-stage state, formed from the resin composition described above, and a metal foil 1, laminated in that order. This type of metal foil with a resin 200 has excellent adhesion between the resin layer 20 and metal foil 1 when it is applied in a multilayer wiring board and cured (in the C-stage state).

The metal foil 1 used will generally be a copper foil or aluminum foil. The thickness of the metal foil 1 will usually be 5-200 μm, as used for the laminated sheet. The metal foil 1 may be a composite foil with a three-layer structure provided with an interlayer made of nickel, nickel-phosphorus, nickel-tin alloy, nickel-iron alloy, lead, lead-tin alloy or the like, having a 0.5-15 μm copper layer and a 10-300 μm copper layer on either side, or a composite foil with a two-layer structure comprising aluminum and copper foils. Commercially available copper foils include GTS, GTS-MP, GTS-FLP, GY, GY-MP, F0-WS, F1-WS, F2-WS, TSTO, DT-GL and DT-GLD (all product names of Furukawa Circuit Foil Co., Ltd.), SLP and YGP (both product names of Nippon Denkai Co., Ltd.) and 3EC-VLP (product name of Mitsui Kinzoku Co., Ltd.).

This metal foil with a resin can be produced, for example, by coating a metal foil with a varnish prepared by the same method described above, and drying it. The drying is preferably accomplished at a temperature such that the volatilization rate of the organic solvent in the varnish is high and curing reaction of the resin composition is not accelerated. Usually, this temperature is preferably in the range of 80° C.-180° C. and more preferably no higher than 150° C. The drying time is preferably adjusted as appropriate for balance with the gelling time of the varnish. The drying is accomplished to preferably at least 80 wt % volatilization, more preferably at least 90 wt % volatilization and even more preferably at least 95 wt % volatilization of the solvent used in the varnish.

Coating of the varnish may be accomplished, for example, using a comma coater or bar coater that passes a coating substance between a gap, or a die coater that performs coating by ejecting varnish with an adjusted flow rate from a nozzle. When the thickness of the coating film in the varnish state is 50-500 μm, it is preferred to use a die coater.

The varnish coating amount is preferably an amount such that the thickness of the resin layer in the B-stage state after drying is 3-80 μm, and more preferably 20-80 μm.

[Adhesive Film]

Figure 3:
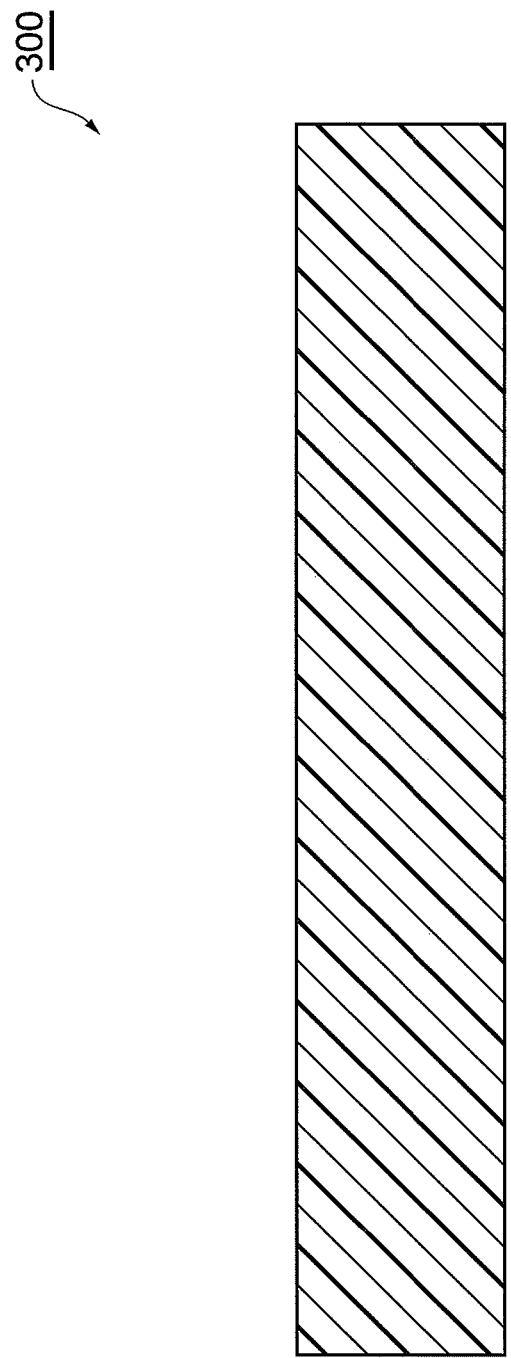
FIG. 3 is a schematic cross-sectional view showing an embodiment of an adhesive film according to the invention.

FIG. 3 is a schematic cross-sectional view showing an embodiment of an adhesive film according to the invention. The adhesive film 300 shown in FIG. 3 is formed from the aforementioned resin composition. The adhesive film 300 is in the B-stage state.

The adhesive film 300 can be produced, for example, by coating a releasable base material with a varnish prepared by the same method described above, and drying it. The releasable base material is peeled off just before use of the adhesive film. The drying is preferably accomplished at a temperature such that the volatilization rate of the organic solvent in the varnish is high and curing reaction of the resin composition is not accelerated. Usually, this temperature is preferably in the range of 80° C.-180° C. and more preferably no higher than 150° C. The drying time is preferably adjusted as appropriate for balance with the gelling time of the varnish. The drying is accomplished to preferably at least 80 wt % volatilization, more preferably at least 90 wt % volatilization and even more preferably at least 95 wt % volatilization of the solvent used in the varnish.

The releasable base material to be coated with the varnish is not particularly restricted so long as it can withstand the temperature to which it is to be subjected during drying, and a commonly employed release agent-attached polyethylene terephthalate film, polyimide film or aramid film, or a release agent-attached metal foil such as an aluminum foil, may be used.

Coating of the varnish may be accomplished, for example, using a comma coater that passes a coating substance between a gap, or a die coater that performs coating by ejecting varnish with an adjusted flow rate from a nozzle. When the thickness of the coating film in the varnish state is to be 50-500 μm, it is preferred to use a die coater.

The thickness of the adhesive film 300 is preferably such that the thickness in the B-stage state after drying is 3-80 μm, and more preferably 20-80 μm.

[Metal-Clad Laminate]

FIG. 4 is a schematic cross-sectional view of an embodiment of a metal-clad laminate according to the invention. The metal-clad laminate 400 shown in FIG. 4 has a structure in which a composite resin layer 40, as the cured product of a prepreg 100, is sandwiched between 2 metal foils 1. Curing the prepeg 100 hardens the resin layer 20 of the prepreg 100, forming cured resin layers 20a. The metal foil 1 used may be one mentioned above.

The metal-clad laminate 400 may be produced, for example, by sandwiching the prepreg between 2 metal foils 1 and heat pressing the stack. The heating temperature will normally be a temperature in the range of 150-280° C., but it is preferably a temperature in the range of 180° C.-250° C. The pressure will normally be a pressure in the range of 0.5-20 MPa, and is preferably a pressure in the range of 1-8 MPa.

The metal-clad laminate 400 shown in FIG. 4 has only a single composite resin layer 40, but the composite resin layer 40 may include multiple layers. In this case, a stack comprising a plurality of laminated prepregs may be heated and pressed after being sandwiched between 2 metal foils. The thickness of the composite resin layer 40 is preferably 13-110 μm. When it consists of multiple layers, the total thickness of the layers is preferably 13-110 μm.

The metal-clad laminate 400 shown in FIG. 4 is a double-sided metal-clad laminate with 2 metal foils, but a single metal foil may be used instead. Specifically, it may be a single-sided metal-clad laminate. When a single metal foil is used, hot pressing may be performed after the metal foil has been situated on one side of the prepreg. The thickness of the metal foil 1 will usually be about 5-200 μm. The total thickness of the metal-clad laminate 400 is preferably no greater than 200 μm. If the thickness of the metal-clad laminate 400 is within this range, satisfactory bendability will be obtained.

The thickness of the omposite resin layer 40 obtained by curing the metal foil and prepreg can be measured by observing a cross-section of the metal-clad laminate with an electron microscope or metallographic microscope, for example. The thickness of the cured resin layer 20a of the composite resin layer 40 (the thickness of the cured resin layer between the surface of the composite resin layer 40 and the surface of the base material 2) can be measured, for example, by observing a photograph of a cross-section of the metal-clad laminate. In the cross-sectional photograph, the normal from a straight line connecting a height facing the metal foil 1 side of the base material 2 and an adjacent height facing the metal foil 1 side is drawn toward the metal foil 1 side. The distance between the intersection of the normal with the interface between the metal foil 1 and the composite resin layer 40, and its intersection with the straight line connecting the heights, is measured. The measurement is performed at 5 locations, and the average value may be recorded as the thickness of the cured resin layer 20a. Before producing the metal-clad laminate, a micrometer may be used to confirm the thicknesses of the prepreg, metal foil with a resin, adhesive film, metal-clad laminate and metal foil.

The 2 metal foils may both be omitted, but a metal-clad laminate having a metal foil can be used as a printed circuit board by forming a circuit on the metal foil. A printed circuit board fabricated in this manner may be used as a flexible circuit board, allowing production of a substrate that can be compactly housed. In addition, multilayering of such a printed circuit board with a conventional rigid substrate allows production of a rigid-flex substrate that can be compactly housed.

The embodiments described above are preferred embodiments of the invention, but the invention is not limited thereto.

EXAMPLES

The invention will now be described in greater detail by examples, with the understanding that the invention is not limited to these examples.

Examples A-1 to A-4 and Comparative Examples A-1 and A-2

Synthesis Example A-1

In a 1-liter separable flask equipped with a cock-stoppered 25-mL water measuring receptacle connected to a reflux condenser, and a thermometer and stirrer, there were charged 83.0 g (0.10 mol) of the reactive silicone oil KF8010 (product name of Shin-Etsu Chemical Co., Ltd., amine equivalents: 415), 41.1 g (0.10 mol) of BAPP (2.2-bis[4-(4-aminophenoxy)phenyl]propane) as an aromatic diamine, 80.7 g (0.42 mol) of TMA (trimellitic anhydride) and 604 g of NMP (N-methyl-2-pyrrolidone) as an aprotic polar solvent, and the mixture was stirred at 80° C. for 30 minutes.

After loading 150 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 65.1 g (0.26 mol) of MDI (4,4'-diphenylmethane diisocyanate) was loaded in as an aromatic diisocyanate, and reaction was conducted at 180° C. for 2 hours. The mixture was again cooled to 50° C., 4.2 g (0.02 mol) of trimesic acid (1,3,5-benzenetricarboxylic acid) was loaded in, and reaction was conducted at 160° C. for 1 hour. Upon completion of the reaction there was obtained an NMP solution containing a polyamideimide resin. The number-average molecular weight of the polyamideimide was 18,090, and the solid concentration of the varnish was 29 wt %.

Synthesis Example A-2

In a 1-liter separable flask equipped with a cock-stoppered 25-mL water measuring receptacle connected to a reflux condenser, and a thermometer and stirrer, there were charged 49.8 g (0.06 mol) of the reactive silicone oil KF8010 (product name of Shin-Etsu Chemical Co., Ltd., amine equivalents: 415), 57.5 g (0.14 mol) of BAPP (2.2-bis[4-(4-aminophenoxy)phenyl]propane) as an aromatic diamine, 80.7 g (0.42 mol) of TMA (trimellitic anhydride) and 565 g of NMP (N-methyl-2-pyrrolidone) as an aprotic polar solvent, and the mixture was stirred at 80° C. for 30 minutes.

After loading 150 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 65.1 g (0.26 mol) of MDI (4,4'-diphenylmethane diisocyanate) was loaded in as an aromatic diisocyanate, and reaction was conducted at 180° C. for 2 hours. The mixture was again, cooled to 50° C., 4.2 g (0.02 mol) of trimesic acid (1,3,5-benzenetricarboxylic acid) was loaded in, and reaction was conducted at 160° C. for 1 hour. Upon completion of the reaction there was obtained an NMP solution containing a polyamideimide resin. The number-average molecular weight of the polyamideimide was 18,860, and the solid concentration of the varnish was 29 wt %.

Synthesis Example A-3

In a 1-liter separable flask equipped with a cock-stoppered 25-mL water measuring receptacle connected to a reflux condenser, and a thermometer and stirrer, there were charged 49.8 g (0.06 mol) of the reactive silicone oil KF8010 (product name of Shin-Etsu Chemical Co., Ltd., amine equivalents: 415), 32.8 g (0.08 mol) of BAPP (2.2-bis[4-(4-aminophenoxy)phenyl]propane) as an aromatic diamine, 120.0 g (0.06 mol) of JEFFAMINE D2000 (product name of Huntsman Corp., amine equivalents: 1000), 80.7 g (0.42 mol) of TMA (trimellitic anhydride) and 508 g of NMP (N-methyl-2-pyrrolidone) as an aprotic polar solvent, and the mixture was stirred at 80° C. for 30 minutes.

After loading 150 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 65.1 g (0.26 mol) of MDI (4,4'-diphenylmethane diisocyanate) was loaded in as an aromatic diisocyanate, and reaction was conducted at 180° C. for 2 hours. The mixture was again cooled to 50° C., 4.2 g (0.02 mol) of trimesic acid (1,3,5-benzenetricarboxylic acid) was loaded in, and reaction was conducted at 160° C. for 1 hour. Upon completion of the reaction there was obtained an NIVIP solution containing a polyamideimide resin. The number-average molecular weight of the polyamideimide was 19,130, and the solid concentration of the varnish was 28 wt %.

Synthesis Example A-4

In a 1-liter separable flask equipped with a cock-stoppered 25-mL water measuring receptacle connected to a reflux condenser, and a thermometer and stirrer, there were charged 2000.0 g (0.10 mol) of the aliphatic diamine D-2000 (product name of Huntsman Corp., amine equivalents: 1000), 41.1 g (0.10 mol) of BAPP (2.2-bis[4-(4-aminophenoxy)phenyl]propane) as an aromatic diamine, 80.7 g (0.42 mol) of TMA (trimellitic anhydride) and 704 g of NMP (N-methyl-2-pyrrolidone) as an aprotic polar solvent, and the mixture was stirred at 80° C. for 30 minutes.

After loading 150 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 65.1 g (0.26 mol) of MDI (4,4'-diphenylmethane diisocyanate) was loaded in as an aromatic diisocyanate, and reaction was conducted at 180° C. for 2 hours. The mixture was again cooled to 50° C., 4.2 g (0.02 mol) of trimesic acid (1,3,5-benzenetricarboxylic acid) was loaded in, and reaction was conducted at 160° C. for 1 hour. Upon completion of the reaction there was obtained an NMP solution containing a polyamideimide resin. The number-average molecular weight of the polyamideimide was 19,140, and the solid concentration of the varnish was 34 wt %.

Comparative Synthesis Example A-1

In a 1-liter separable flask equipped with a cock-stoppered 25-mL water measuring receptacle connected to a reflux condenser, and a thermometer and stirrer, there were charged 83.0 g (0.10 mol) of the reactive silicone oil KF8010 (product name of Shin-Etsu Chemical Co., Ltd., amine equivalents: 415), 41.1 g (0.10 mol) of BAPP (2.2-bis[4-(4-aminophenoxy)phenyl]propane) as an aromatic diamine, 80.7 g (0.42 mol) of TMA (trimellitic anhydride) and 580 g of NMP (N-methyl-2-pyrrolidone) as an aprotic polar solvent, and the mixture was stirred at 80° C. for 30 minutes.

After loading 150 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 60.1 g (0.24 mol) of MDI (4,4'-diphenylmethane diisocyanate) was loaded in as an aromatic diisocyanate, and reaction was conducted at 180° C. for 2 hours. Upon completion of the reaction there was obtained an NMP solution containing a polyamideimide resin. The number-average molecular weight of the polyamideimide was 31,780, and the solid concentration of the varnish was 29 wt %.

Comparative Synthesis Example A-2

In a 1-liter separable flask equipped with a cock-stoppered 25-mL water measuring receptacle connected to a reflux condenser, and a thermometer and stirrer, there were charged 83.0 g (0.10 mol) of the reactive silicone oil KF8010 (product name of Shin-Etsu Chemical Co., Ltd., amine equivalents: 415), 41.1 g (0.10 mol) of BAPP (2.2-bis[4-(4-aminophenoxy)phenyl]propane) as an aromatic diamine, 80.7 g (0.42 mol) of TMA (trimellitic anhydride) and 604 g of NMP (N-methyl-2-pyrrolidone) as an aprotic polar solvent, and the mixture was stirred at 80° C. for 30 minutes.

After loading 150 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 65.1 g (0.26 mol) of MDI (4,4'-diphenylmethane diisocyanate) was loaded in as an aromatic diisocyanate, and reaction was conducted at 180° C. for 2 hours. The mixture was again cooled to 50° C., 3.8 g (0.02 mol) of trimellitic anhydride was loaded in, and reaction was conducted at 160° C. for 1 hour. Upon completion of the reaction there was obtained an NMP solution containing a polyamideimide resin. The number-average molecular weight of the polyamideimide was 22,370, and the solid concentration of the varnish was 29 wt %.

The number-average molecular weight of the polyamideimide of this synthesis example may be determined by calculation using standard polystyrene, from a chromatogram of the molecular weight distribution of the polyamideimide measured (at 25° C.) by GPC (gel permeation chromatography). The GPC eluent used was a solution of 0.06 mol/L of phosphoric acid and 0.03 mol/L of lithium bromide monohydrate in a tetrahydrofuran/dimethylformamide=50/50 (volume ratio) mixture, and the columns used were two GL-S300 MDT-5 (product name of Hitachi High-Technologies Corp.) columns connected in series.

Example A-1

After mixing 310.0 g of an NMP solution of the polyamideimide resin of Synthesis Example A-1 (29 wt % solid resin content), 20.0 g of ZX-1548-2 (product name of Tohto Kasei Co., Ltd.) (methyl ethyl ketone solution with 50 wt % solid resin content) as an epoxy resin and 0.1 g of 2-ethyl-4-methylimidazole, the mixture was stirred for about 1 hour until uniformity of the resin and then allowed to stand for 24 hours at room temperature for defoaming to obtain a resin composition varnish.

Example A-2

After mixing 310.0 g of an NMP solution of the polyamideimide resin of Synthesis Example A-2 (29 wt % solid resin content), 20.0 g of NC3000H (product name of Nippon Kayaku Co., Ltd.) (methyl ethyl ketone solution with 50 wt % solid resin content) as an epoxy resin and 0.1 g of 2-ethyl-4-methylimidazole, the mixture was stirred for about 1 hour until uniformity of the resin and then allowed to stand for 24 hours at room temperature for defoaming to obtain a resin composition varnish.

Example A-3

After mixing 321.0 g of an NMP solution of the polyamideimide resin of Synthesis Example A-3 (28 wt % solid resin content), 10.0 g of NC3000H (product name of Nippon Kayaku Co., Ltd.) (methyl ethyl ketone solution with 50 wt % solid resin content) and 10.0 g of HP4032D (product name of DIC Corp.) (methyl ethyl ketone solution with 50 wt % solid resin content) as epoxy resins and 0.1 g of 2-ethyl-4-methylimidazole, the mixture was stirred for about 1 hour until uniformity of the resin and then allowed to stand for 24 hours at room temperature for defoaming to obtain a resin composition varnish.

Example A-4

After mixing 264.7 g of an NMP solution of the polyamideimide resin of Synthesis Example A-4 (34 wt % solid resin content) and 20.0 g of ZX-1548-2 (product name of Tohto Kasei Co., Ltd.) (methyl ethyl ketone solution with 50 wt % solid resin content) as an epoxy resin, the mixture was stirred for about 1 hour until uniformity of the resin and then allowed to stand for 24 hours at room temperature for defoaming to obtain a resin composition varnish.

Comparative Example A-1

A resin composition varnish was prepared in the same manner as Example A-1, except for using the polyamideimide resin of Comparative Synthesis Example A-1.

Comparative Example A-2

A resin composition varnish was prepared in the same manner as Example A-1, except for using the polyamideimide resin of Comparative Synthesis Example A-2.

(Fabrication of Adhesive Film)

Each of the varnishes produced in Examples A-1 to A-4 and Comparative Examples A-1 and A-2 was coated onto a 50 µm-thick release-treated polyethylene terephthalate film (PUREX A63 by Teijin Tetoron Film) with a bar coater to a thickness of 50 µm in the B-stage state after drying, and then heated and dried at 140° C. for 15 minutes to obtain an adhesive film.

(Fabrication of Resin-Coated Copper Foil)

Each of the varnishes produced in Examples A-1 to A-4 and Comparative Examples A-1 and A-2 was coated onto the roughened surface (surface roughness: Rz=2.6 µm) of an 18 µm-thick electrolytic copper foil (F3-WS-12, product of Furukawa Circuit Foil Co., Ltd.) with a bar coater to a thickness of 50 µm in the B-stage state after drying, and then heated and dried at 140° C. for 12 minutes to obtain a resin-coated copper foil.

(Fabrication of Prepreg and Metal-Clad Laminate)

Each of the varnishes produced in Examples A-1 to A-4 and Comparative Examples A-1 and A-2 was impregnated into a 19 µm-thick glass cloth (1027, product of Asahi Kasei E-Materials Corp.) and then heated and dried at 150° C. for 15 minutes to obtain a prepreg with a 70 wt % resin content. The results of measuring the thickness of each prepreg produced in Examples A-1 to A-4 and Comparative Examples A-1 and A-2 using a micrometer were all 48 µm.

A 12 µm-thick electrolytic copper foil (trade name: F2-WS-12 by Furukawa Circuit Foil Co., Ltd.) was stacked onto both sides of the prepreg with the roughened surface (surface roughness: Rz=2.1 µm) facing the prepreg, and subjected to the following pressing conditions to fabricate a double-sided copper-clad laminate. As the pressing conditions, the press section of the pressing machine was adjusted to a degree of vacuum of 40 hPa, the material was hot pressed at the prescribed molding pressure with a temperature-elevating rate of 5° C./min, and upon reaching the prescribed molding temperature, the molding temperature was maintained for a prescribed period of time (molding time), and the hot pressing was then suspended and followed by air-cooling to restore the press section to atmospheric pressure. The molding pressure was 4.0 MPa, the molding temperature was 230° C. and the molding time was 90 minutes. A section of the double-sided copper-clad laminate was cut out, the copper foil on both sides was etched off and the thickness of the composite resin layer was measured with a micrometer, and this yielded results of 45 µm for all of Examples A-1 to A-4 and Comparative Examples A-1 and A-2.

(Fabrication of Sample for Evaluation of Mechanical Properties)

Two adhesive films were stacked, a 12 µm-thick electrolytic copper foil (trade name: F2-WS-12 by Furukawa Circuit Foil Co., Ltd.) was stacked onto both sides thereof with the roughened surface facing the adhesive film, and press laminated under pressing conditions with a molding pressure of 2.0 MPa, a molding temperature of 230° C. and a molding time of 60 minutes, after which the copper foil was etched to produce a sample for evaluation of the mechanical properties.

(Fabrication of Sample for Bending Test)

A line pattern with a 1 mm width and 100 mm length was formed on one side of the double-sided copper-clad laminate by etching, to prepare configuration 1. A resin-coated copper foil with the same composition was stacked onto both sides of the sample and laminated therewith under pressing conditions with a molding pressure of 4.0 MPa, a molding temperature of 230° C. and a molding time of 60 minutes, after which the copper foils on both sides were etched to prepare configuration 2.

[Evaluation Results]

(Evaluation of Base Material Embedding Property)

The prepreg of each of the examples and comparative examples and a 12 µm electrolytic copper foil (F2-WS-12, product of Furukawa Circuit Foil Co., Ltd.) were stacked onto both sides of a double-sided circuit board having a prescribed circuit pattern (conductor thickness: 12 µm, base material, I-671 by Hitachi Chemical Co., Ltd.), with the roughened surfaces facing the prepreg, and then pressed under pressing conditions with a molding pressure of 4.0 MPa, a molding temperature of 230° C. and a molding time of 60 minutes, to produce a double-sided copper-clad laminate. Next, the copper foil was etched off and the embedding property of the resin into the conductor sections was visually confirmed. Samples that were confirmed to have no surface level differ ence from the circuit pattern on the resin surface and uniform embedding across the entire surface, with no whitening due to voids between the substrate and the resin, were evaluated as "good", while those with even one area of whitening due to voids between the substrate and the resin were evaluated as "poor". The evaluation results are shown in Table 1.

with a chuck distance of 60 mm and a pull rate of 5 mm/min. The measurement was conducted in both the B stage and C-stage. The evaluation results are shown in Table 1. The test pieces of the examples all had high elongation regardless of the molecular weight, whereas the test pieces of the comparative examples all had low elongation.

TABLE 1

|  | Example A-1 | Example A-2 | Example A-3 | Example A-4 | Comp. Ex. A-1 | Comp. Ex. A-2 |
|---|---|---|---|---|---|---|
| Polyamideimide | Synthesis Ex. A-1 | Synthesis Ex. A-2 | Synthesis Ex. A-3 | Synthesis Ex. A-4 | Comp. Synthesis Ex. A-1 | Comp. Synthesis Ex. A-2 |
| Polyamideimide mol. wt. | 18,090 | 18,860 | 19,130 | 19,140 | 31,780 | 22,370 |
| Varnish solid content (wt %) | 29 | 29 | 28 | 34 | 29 | 29 |
| Polyamideimide (g) | 90 | 90 | 90 | 90 | 90 | 90 |
| ZX-1548-2 (g) | 10 | — | — | 10 | 10 | 10 |
| NC3000H (g) | — | 10 | 5 | — | — | — |
| HP4032D (g) | — | — | 5 | — | — | — |
| B-stage breaking strength (MPa) | 38 | 44 | 50 | 35 | 45 | 38 |
| B-stage breaking elongation (%) | 25 | 23 | 32 | 45 | 22 | 20 |
| C-stage breaking strength (MPa) | 47 | 51 | 55 | 43 | 50 | 45 |
| C-stage breaking elongation (%) | 27 | 26 | 35 | 52 | 14 | 19 |
| Bendability (structure 1) | Good | Good | Good | Good | Cracking | Poor |
| Bendability (structure 2) | Good | Good | Good | Good | Good | Poor |
| Solder heat resistance | Good | Good | Good | Good | Good | Good |
| Copper foil bonding strength (kN/m) | 1.1 | 0.9 | 0.8 | 0.8 | 0.8 | 0.8 |
| Embedding property | Good | Good | Good | Good | Poor | Good |

(Evaluation of Copper Foil Bonding Strength)

The copper foil bonding strength (peel strength) of the obtained metal-clad laminate was measured. The copper foil on one side of the metal-clad laminate was etched into a 5 mm-wide band, and the force upon peeling the copper foil at a rate of 50 mm/min in the direction of 90 degrees was measured with a rheometer by Fudo Industry Co., Ltd., calculated in terms of the peel strength per 10 mm width (2-fold) and recorded as the bonding strength. The evaluation results are shown in Table 1. The results were 0.8-1.1 kN/m for all combinations of F2-WS-12 and the prepregs of Examples A-1 to A-3.

(Evaluation of Soldering Heat Resistance)

The obtained metal-clad laminate was dipped in solder baths at 260° C., 288° C. and 300° C., and the soldering heat resistance was measured. As a result, for all of the metal-clad laminates of Examples A-1 to A-4, and Comparative Example A-1 and Comparative Example A-2, no abnormalities such as blister or peeling were seen for at least 5 minutes at all temperatures. This result was indicated as "good", and is shown in Table 1.

(Evaluation of Bendability)

The bending test samples with configuration 1 and configuration 2 were used to evaluate the base material bendability. Samples which could be folded without fracturing and without cracking when a crease was formed by hand were evaluated as "good", those which had cracks when folded with a crease were evaluated as "cracking", and those wherein the base material fractured when folded with a crease were evaluated as "poor". The evaluation results are shown in Table 1. As a result, Examples A-1 to A-4 had excellent flexibility to allow folding as desired. Comparative Example A-1 was foldable, but was more prone to cracking than the examples. Comparative Example A-2 was unfoldable and suffered fracture.

(Evaluation of Mechanical Properties (Breaking Strength and Breaking Elongation))

The breaking strength and breaking elongation were measured as mechanical properties. The breaking strength and elongation of a test piece of the evaluation adhesive film cut to a 10 mm width and an 80 mm length were measured using a rheometer (EZ-Test by Shimadzu Corp.), under conditions Comparative Examples A-1 and A-2 had lower breaking elongation after curing, i.e. in the C-stage state, compared to the B-stage state, but in the examples, the breaking elongation after curing, i.e. in the C-stage state, was instead greater than in the B-stage state.

It was thus confirmed that the resin compositions of the examples had more excellent moldability and could form products with lower reduction in cured elongation, with the ability to fold without cracking when formed into printed circuit boards and capable of being housed at high density in electronic device packages, compared to the resin compositions of the comparative examples.

Examples B-1 to B-16, Comparative Example B-1

Synthesis Example B-1

In a 1-liter separable flask equipped with a cock-stoppered 25-mL water measuring receptacle connected to a reflux condenser, and a thermometer and stirrer, there were charged 43.7 g (0.05 mol) of the reactive silicone oil X-22-9412 (product name of Shin-Etsu Chemical Co., Ltd., amine equivalents: 437), 80.0 g (0.04 mol) of D2000 (product name of Huntsman Corp., amine equivalents: 1000) as an aliphatic diamine, 2.1 g (0.01 mol) of WONDAMINE WHM (product name of New Japan Chemical Co., Ltd.), 40.3 g (0.21 mol) of TMA (trimellitic anhydride) and 357 g of NMP (N-methyl-2-pyrrolidone) as an aprotic polar solvent, and the mixture was stirred at 80° C. for 30 minutes.

After loading 120 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 32.5 g (0.13 mol) of MDI (4,4'-diphenylmethane diisocyanate) was loaded in as an aromatic diisocyanate, and reaction was conducted at 180° C. for 2 hours. The mixture was again cooled to 50° C., 2.6 g (0.0122 mol) of trimesic acid (1,3,5-benzenetricarboxylic acid) was loaded in, and reaction was conducted at 160° C. for 1 hour. Upon completion of the reaction there was obtained an NMP solution containing a polyamideimide resin. The number-average molecular weight of the polyamideimide was 30,500, and the solid concentration of the varnish was 34 wt %. Table 2 shows the major components, their contents (g), the number-average molecular weights (Mn) of the polyamideimides and the solid concentrations (NV) of the varnishes.

Synthesis Example B-2

In a 1-liter separable flask equipped with a cock-stoppered 25-mL water measuring receptacle connected to a reflux condenser, and a thermometer and stirrer, there were charged 43.7 g (0.05 mol) of the reactive silicone oil X-22-9412 (product name of Shin-Etsu Chemical Co., Ltd., amine equivalents: 437), 80.0 g (0.04 mol) of D2000 (product name of Huntsman Corp., amine equivalents: 1000) as an aliphatic diamine, 2.1 g (0.01 mol) of WONDAMINE WHM (product name of New Japan Chemical Co., Ltd.), 40.3 g (0.21 mol) of TMA (trimellitic anhydride) and 360 g of NMP (N-methyl-2-pyrrolidone) as an aprotic polar solvent, and the mixture was stirred at 80° C. for 30 minutes.

After loading 120 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 35.0 g (0.14 mol) of MDI (4,4'-diphenylmethane diisocyanate) was loaded in as an aromatic diisocyanate, and reaction was conducted at 180° C. for 2 hours. The mixture was again cooled to 50° C., 2.8 g (0.0134 mol) of trimesic acid (1,3,5-benzenetricarboxylic acid) was loaded in, and reaction was conducted at 160° C. for 1 hour. Upon completion of the reaction there was obtained an NMP solution containing a polyamideimide resin. The number-average molecular weight of the polyamideimide was 27,900, and the solid concentration of the varnish was 34 wt %. Table 2 shows the major components, their contents (g), the number-average molecular weights (Mn) of the polyamideimides and the solid concentrations (NV) of the varnishes.

Synthesis Examples B-3 to B-5

The reactive silicone oil X-22-9412 (product name of Shin-Etsu Chemical Co., Ltd., amine equivalents: 437), the aliphatic diamine D2000 (product name of Huntsman Corp., amine equivalents: 1000), WONDAMINE WHM (product name of New Japan Chemical Co., Ltd.) and TMA (trimellitic anhydride) were charged in the amounts shown in Table 2, in the same manner as Synthesis Example B-1, and NMP (N-methyl-2-pyrrolidone) as an aprotic polar solvent was charged in at 363 g in Synthesis Example B-3, 354 g in Synthesis Example B-4 and 351 g in Synthesis Example B-5, after which each mixture was stirred at 80° C. for 30 minutes.

After loading 120 mL of toluene as an aromatic hydrocarbon which is azeotropic with water, in the same manner as Synthesis Example B-1, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., MDI (4,4'-diphenylmethane diisocyanate) was loaded in as an aromatic diisocyanate in the amount shown in Table 2, and reaction was conducted at 180° C. for 2 hours. The mixture was again cooled to 50° C., trimesic acid (1,3,5-benzenetricarboxylic acid) was loaded in the amount shown in Table 2, and reaction was conducted at 160° C. for 1 hour. Upon completion of the reaction there was obtained an NMP solution containing a polyamideimide resin. Table 2 shows the number-average molecular weights (Mn) of the polyamideimides and the solid concentrations (NV) of the varnishes.

Synthesis Example B-6

In a 1-liter separable flask equipped with a cock-stoppered 25-mL water measuring receptacle connected to a reflux condenser, and a thermometer and stirrer, there were charged 43.7 g (0.05 mol) of the reactive silicone oil X-22-9412 (product name of Shin-Etsu Chemical Co., Ltd., amine equivalents: 437), 32.0 g (0.08 mol) of D400 (product name of Huntsman Corp., amine equivalents: 200) as an aliphatic diamine, 2.1 g (0.01 mol) of WONDAMINE WHM (product name of New Japan Chemical Co., Ltd.), 60.5 g (0.315 mol) of TMA (trimellitic anhydride) and 326 g of NMP (N-methyl-2-pyrrolidone) as an aprotic polar solvent, and the mixture was stirred at 80° C. for 30 minutes.

After loading 120 mL of toluene as an aromatic hydrocarbon which is azeotropic with water, the temperature was raised and the mixture was circulated at 160° C. for 2 hours. Upon confirming that at least about 5.7 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 52.6 g (0.21 mol) of MDI (4,4'-diphenylmethane diisocyanate) was loaded in as an aromatic diisocyanate, and reaction was conducted at 180° C. for 2 hours. The mixture was again cooled to 50° C., 2.7 g (0.0129 mol) of trimesic acid (1,3,5-benzenetricarboxylic acid) was loaded in, and reaction was conducted at 160° C. for 1 hour. Upon completion of the reaction there was obtained an NMP solution containing a polyamideimide resin. The number-average molecular weight of the polyamideimide was 26,400, and the solid concentration of the varnish was 34 wt %. Table 2 shows the major components, their contents (g), the number-average molecular weights (Mn) of the polyamideimides and the solid concentrations (NV) of the varnishes.

Synthesis Example B-7

In a 1-liter separable flask equipped with a cock-stoppered 25-mL water measuring receptacle connected to a reflux condenser, and a thermometer and stirrer, there were charged 83.0 g (0.095 mol) of the reactive silicone oil X-22-9412 (product name of Shin-Etsu Chemical Co., Ltd., amine equivalents: 437), 90.0 g (0.045 mol) of D2000 (product name of Huntsman Corp., amine equivalents: 1000) as an aliphatic diamine, 2.1 g (0.01 mol) of WONDAMINE WHM (product name of New Japan Chemical Co., Ltd.), 60.5 g (0.315 mol) of TMA (trimellitic anhydride) and 481 g of NMP (N-methyl-2-pyrrolidone) as an aprotic polar solvent, and the mixture was stirred at 80° C. for 30 minutes.

After loading 120 mL of toluene as an aromatic hydrocarbon which is azeotropic with water, the temperature was raised and the mixture was circulated at 160° C. for 2 hours. Upon confirming that at least about 5.7 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 45.1 g (0.18 mol) of MDI (4,4'-diphenylmethane diisocyanate) was loaded in as an aromatic diisocyanate, and reaction was conducted at 180° C. for 2 hours. The mixture was again cooled to 50° C., 3.0 g (0.0141 mol) of trimesic acid (1,3,5-benzenetricarboxylic acid) was loaded in, and reaction was conducted at 160° C. for 1 hour. Upon completion of the reaction there was obtained an NMP solution containing a polyamideimide resin. The number-average molecular weight of the polyamideimide was 35,600, and the solid concentration of the varnish was 34 wt %. Table 2 shows the major components, their contents (g), the number-average molecular weights (Mn) of the polyamideimides and the solid concentrations (NV) of the varnishes.

Synthesis Example B-8

In a 1-liter separable flask equipped with a cock-stoppered 25-mL water measuring receptacle connected to a reflux condenser, and a thermometer and stirrer, there were charged 39.3 g (0.04 mol) of the reactive silicone oil X-22-9412 (product name of Shin-Etsu Chemical Co., Ltd., amine equivalents: 437), 90.0 g (0.045 mol) of D2000 (product name of Huntsman Corp., amine equivalents: 1000) as an aliphatic diamine, 2.1 g (0.01 mol) of WONDAIVIINE WHM (product name of New Japan Chemical Co., Ltd.), 40.3 g (0.21 mol) of TMA (trimellitic anhydride) and 354.2 g of NMP (N-methyl-2-pyrrolidone) as an aprotic polar solvent, and the mixture was stirred at 80° C. for 30 minutes.

After loading 120 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 35.0 g (0.14 mol) of MDI (4,4'-diphenylmethane diisocyanate) was loaded in as an aromatic diisocyanate, and reaction was conducted at 180° C. for 2 hours. The mixture was again cooled to 50° C., 2.8 g (0.0134 mol) of trimesic acid (1,3,5-benzenetricarboxylic acid) was loaded in, and reaction was conducted at 160° C. for 1 hour. Upon completion of the reaction there was obtained an NMP solution containing a polyamideimide resin. The number-average molecular weight of the polyamideimide was 28,600, and the solid concentration of the varnish was 38 wt %. Table 2 shows the major components, their contents (g), the number-average molecular weights (Mn) of the polyamideimides and the solid concentrations (NV) of the varnishes.

Synthesis Example B-9

In a 1-liter separable flask equipped with a cock-stoppered 25-mL water measuring receptacle connected to a reflux condenser, and a thermometer and stirrer, there were charged 26.2 g (0.030 mol) of the reactive silicone oil X-22-9412 (product name of Shin-Etsu Chemical Co., Ltd., amine equivalents: 437), 120.0 g (0.06 mol) of D2000 (product name of Huntsman Corp., amine equivalents: 1000) as an aliphatic diamine, 2.1 g (0.01 mol) of WONDAMINE WH M (product name of New Japan Chemical Co., Ltd.), 40.3 g (0.21 mol) of TMA (trimellitic anhydride) and 385.5 g of NMP (N-methyl-2-pyrrolidone) as an aprotic polar solvent, and the mixture was stirred at 80° C. for 30 minutes.

After loading 120 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 35.0 g (0.14 mol) of MDI (4,4'-diphenylmethane diisocyanate) was loaded in as an aromatic diisocyanate, and reaction was conducted at 180° C. for 2 hours. The mixture was again cooled to 50° C., 3.6 g (0.0169 mol) of trimesic acid (1,3,5-benzenetricarboxylic acid) was loaded in, and reaction was conducted at 160° C. for 1 hour. Upon completion of the reaction there was obtained an NMP solution containing a polyamideimide resin. The number-average molecular weight of the polyamideimide was 24,500, and the solid concentration of the varnish was 40 wt %. Table 2 shows the major components, their contents (g), the number-average molecular weights (Mn) of the polyamideimides and the solid concentrations (NV) of the varnishes.

Synthesis Example B-10

In a 1-liter separable flask equipped with a cock-stoppered 25-mL water measuring receptacle connected to a reflux condenser, and a thermometer and stirrer, there were charged 87.4 g (0.1 mol) of the reactive silicone oil X-22-9412 (product name of Shin-Etsu Chemical Co., Ltd., amine equivalents: 437), 40.3 g (0.21 mol) of TMA (trimellitic anhydride) and 267.8 g of NMP (N-methyl-2-pyrrolidone) as an aprotic polar solvent, and the mixture was stirred at 80° C. for 30 minutes.

After loading 120 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 32.6 g (0.13 mol) of MDI (4,4'-diphenylmethane diisocyanate) was loaded in as an aromatic diisocyanate, and reaction was conducted at 180° C. for 2 hours. The mixture was again cooled to 50° C., 2.0 g (0.0094 mol) of trimesic acid (1,3,5-benzenetricarboxylic acid) was loaded in, and reaction was conducted at 160° C. for 1 hour. Upon completion of the reaction there was obtained an NMP solution containing a polyamideimide resin. The number-average molecular weight of the polyamideimide was 30,100, and the solid concentration of the varnish was 43 wt %. Table 2 shows the major components, their contents (g), the number-average molecular weights (Mn) of the polyamideimides and the solid concentrations (NV) of the varnishes.

Comparative Synthesis Example B-1

In a 1-liter separable flask equipped with a cock-stoppered 25-mL water measuring receptacle connected to a reflux condenser, and a thermometer and stirrer, there were charged 52.4 g (0.06 mol) of the reactive silicone oil X-22-9412 (product name of Shin-Etsu Chemical Co., Ltd., amine equivalents: 437), 80.0 g (0.04 mol) of D2000 (product name of Huntsman Corp., amine equivalents: 1000) as an aliphatic diamine, 40.3 g (0.21 mol) of TMA (trimellitic anhydride) and 360 g of NMP (N-methyl-2-pyrrolidone) as an aprotic polar solvent, and the mixture was stirred at 80° C. for 30 minutes.

After loading 150 mL of toluene as an aromatic hydrocarbon which is azeotropic with water, the temperature was raised and the mixture was circulated at 160° C. for 2 hours. Upon confirming that at least about 3.6 mL of water had accumulated in the water measuring receptacle and water distillation had ceased, the temperature was raised to about 190° C. while removing the distillate accumulated in the water measuring receptacle, for removal of the toluene. The mixture was then cooled to 50° C., 35.0 g (0.14 mol) of MDI (4,4'-diphenylmethane diisocyanate) was loaded in as an aromatic diisocyanate, and reaction was conducted at 180° C. for 2 hours. Upon completion of the reaction there was obtained an NMP solution containing a polyamideimide resin. This was subsequently reacted with trimesic acid. The number-average molecular weight of the polyamideimide was 28,900, and the solid concentration of the varnish was 33 wt %. Table 2 shows the major components, their contents (g), the number-average molecular weights (Mn) of the polyamideimides and the solid concentrations (NV) of the varnishes.

The number-average molecular weights of the polyamideimides of the synthesis examples and comparative synthesis examples were determined by calculation using standard polystyrene, from a chromatogram of the molecular weight distribution of polyamideimide measured (at 25° C.) by GPC (gel permeation chromatography). The GPC eluent used was a solution of 0.06 mol/L of phosphoric acid and 0.03 mol/L of lithium bromide monohydrate in a tetrahydrofuran/dimethylformamide=50/50 (volume ratio) mixture, and the columns used were two GL-S300 MDT-5 (product name of Hitachi High-Technologies Corp.) columns connected in series.

Examples B-2 to B-7

After mixing NMP solutions of the polyamideimide resins of each of Synthesis Examples B-2 to B-7 with 20.0 g of NC3000H (product name of Nippon Kayaku Co., Ltd.) (methyl ethyl ketone solution with 50 wt % solid resin content) as an epoxy resin and 0.1 g of 2-ethyl-4-methylimidazole, in the same manner as Example B-1, each mixture was stirred for about 1 hour until uniformity of the resin and then allowed to stand for 24 hours at room temperature for defoaming to obtain a resin composition varnish.

Examples B-8 to B-10

After mixing 264.7 g of an NMP solution of the polyamideimide resin of Synthesis Example B-2 (34 wt % solid resin content) with 20.0 g of EPPN502H (product name of Nippon Kayaku Co., Ltd.), ZX-1548-2 (product name of Tohto Kasei Co., Ltd.) and DER331L (product name of DIC Corp.), listed in Tables 3 and 4, as epoxy resins (all methyl ethyl ketone solutions with 50 wt % solid resin content), 0.1 g of 2-ethyl-4-methylimidazole was added, and each mixture was stirred for about 1 hour until uniformity of the resin and then allowed to stand for 24 hours at room temperature for defoaming to obtain a resin composition varnish.

Examples B-11 to B-12

After mixing NMP solutions of the polyamideimide resin of Synthesis Example B-2 with NC3000H (product name of Nippon Kayaku Co., Ltd.) as an epoxy resin, in the amount listed in Table 4, 0.1 g of 2-ethyl-4-methylimidazole was added, and each mixture was stirred for about 1 hour until uniformity of the resin and then allowed to stand for 24 hours at room temperature for defoaming to obtain a resin composition varnish.

TABLE 2

| | Synthesis Ex. B-1 | Synthesis Ex. B-2 | Synthesis Ex. B-3 | Synthesis Ex. B-4 | Synthesis Ex. B-5 | Synthesis Ex. B-6 | Synthesis Ex. B-7 | Synthesis Ex. B-8 | Synthesis Ex. B-9 | Synthesis Ex. B-10 | Comp. Synthesis Ex. B-1 |
|---|---|---|---|---|---|---|---|---|---|---|---|
| D2000 (g) | 80.0 | 80.0 | 80.0 | 80.0 | 80.0 | 0.0 | 90.0 | 90.0 | 120.0 | 0.0 | 80.0 |
| D400 (g) | 0.0 | 0.0 | 0.0 | 0.0 | 0.0 | 32.0 | 0.0 | 0.0 | 0.0 | 0.0 | 0.0 |
| X-22-9412 (g) | 43.7 | 43.7 | 43.7 | 43.7 | 43.7 | 43.7 | 83.0 | 39.3 | 26.2 | 87.4 | 52.4 |
| KF8010 (g) | 0.0 | 0.0 | 0.0 | 0.0 | 0.0 | 0.0 | 0.0 | 0.0 | 0.0 | 0.0 | 0.0 |
| WHM (g) | 2.1 | 2.1 | 2.1 | 2.1 | 2.1 | 2.1 | 2.1 | 2.1 | 2.1 | 0.0 | 0.0 |
| TMA (g) | 40.3 | 40.3 | 40.3 | 40.3 | 40.3 | 60.5 | 60.5 | 40.3 | 40.3 | 40.3 | 40.3 |
| NMP (g) | 357.0 | 360.0 | 363.0 | 354.0 | 351.0 | 326.0 | 481.0 | 354.2 | 385.5 | 267.8 | 360.0 |
| MDI (g) | 32.5 | 35.0 | 37.5 | 30.0 | 27.5 | 52.6 | 45.1 | 35.0 | 35.0 | 32.6 | 35.0 |
| TMSA (g) | 2.6 | 2.8 | 3.1 | 2.1 | 2.7 | 2.7 | 3.0 | 2.8 | 3.6 | 2.0 | 0.0 |
| Mn | 30,500 | 27,900 | 25,100 | 36,900 | 27,500 | 26,400 | 35,600 | 28,600 | 24,500 | 30,100 | 28,900 |
| NV (wt %) | 34 | 34 | 34 | 34 | 34 | 34 | 34 | 38 | 40 | 43 | 33 |

In Table 2, D2000 and D400 are diamines composing the polyoxypropyleneimide structure of the synthesized polyamideimides. X-22-9412 is a reactive silicone oil comprising vinyl group-bonded silicon, and KF8010 is a reactive silicone oil without an unsaturated bond. TMSA represents trimesic acid. Mn represents the number-average molecular weight of the polyamideimide, and NV represents the solid concentration of the varnish.

Example B-1

After mixing 264.7 g of an NMP solution of the polyamideimide resin of Synthesis Example B-1 (34 wt % solid resin content), 20.0 g of NC-3000H (product name of Nippon Kayaku Co., Ltd.) (methyl ethyl ketone solution with 50 wt % solid resin content) as an epoxy resin and 0.1 g of 2-ethyl-4-methylimidazole, the mixture was stirred for about 1 hour until uniformity of the resin and then allowed to stand for 24 hours at room temperature for defoaming to obtain a resin composition varnish.

Example B-13

After mixing an NMP solution of the polyamideimide resin of Synthesis Example B-8 with NC3000H (product name of Nippon Kayaku Co., Ltd.) as an epoxy resin, in the amount listed in Table 4, 0.1 g of 2-ethyl-4-methylimidazole was added, and the mixture was stirred for about 1 hour until uniformity of the resin and then allowed to stand for 24 hours at room temperature for defoaming to obtain a resin composition varnish.

Example B-14

After mixing an NMP solution of the polyamideimide resin of Synthesis Example B-9 with NC3000H (product name of Nippon Kayaku Co., Ltd.) as an epoxy resin, in the amount listed in Table 4, 0.1 g of 2-ethyl-4-methylimidazole was added, and the mixture was stirred for about 1 hour until uniformity of the resin and then allowed to stand for 24 hours at room temperature for defoaming to obtain a resin composition varnish.

Example B-15

After mixing an NMP solution of the polyamideimide resin of Synthesis Example B-10 with NC3000H (product name of Nippon Kayaku Co., Ltd.) as an epoxy resin, in the amount listed in Table 4, 0.1 g of 2-ethyl-4-methylimidazole was added, and the mixture was stirred for about 1 hour until uniformity of the resin and then allowed to stand for 24 hours at room temperature for defoaming to obtain a resin composition varnish.

Example B-16

After mixing 310.0 g of an NMP solution of the polyamideimide resin of Synthesis Example A-1 (29 wt % solid resin content), 20.0 g of ZX-1548-2 (product name of Tohto Kasei Co., Ltd.) (methyl ethyl ketone solution with 50 wt % solid resin content) as an epoxy resin and 0.1 g of 2-ethyl-4-methylimidazole, the mixture was stirred for about 1 hour until uniformity of the resin and then allowed to stand for 24 hours at room temperature for defoaming to obtain a resin composition varnish.

Comparative Example B-1

A resin composition varnish was prepared in the same manner as Example B-1, except for using the polyamideimide resin of Comparative Synthesis Example B-1.

(Fabrication of Adhesive Film)

Each of the varnishes produced in Examples B-1 to B-16 and Comparative Example B-1 was coated onto a 50 μm-thick release-treated polyethylene terephthalate film (PUREX A63, product name of Teijin Tetoron Film) with a bar coater to a thickness of 50 μm in the B-stage state after drying, and then heated and dried at 140° C. for 15 minutes to obtain an adhesive film.

(Fabrication of Resin-Coated Copper Foil)

Each of the varnishes produced in Examples B-1 to B-16 and Comparative Example B-1 was coated onto the roughened surface (surface roughness: Rz=2.6 μm) of an 18 μm-thick electrolytic copper foil (F3-WS-12, product of Furukawa Circuit Foil Co., Ltd.) with a bar coater to a thickness of 50 μm in the B-stage state after drying, and then heated and dried at 140° C. for 12 minutes to obtain a resin-coated copper foil.

(Fabrication of Prepreg and Metal-Clad Laminate)

Each of the varnishes produced in Examples B-1 to B-16 and Comparative Example B-1 was impregnated into a 19 μm-thick glass cloth (1027, product of Asahi Kasei E-Materials Corp.) and then heated and dried at 150° C. for 15 minutes to obtain a prepreg with a 70 wt % resin content. The results of measuring the thickness of each prepreg produced in Examples B-1 to B-16 and Comparative Example B-1 using a micrometer were all 54-56 μm.

A 12 μm-thick electrolytic copper foil (trade name: F2-WS-12 by Furukawa Circuit Foil Co., Ltd.) was stacked onto both sides of the prepreg with the roughened surface (surface roughness: Rz=2.1 μm) facing the prepreg, and subjected to the following pressing conditions to fabricate a double-sided copper-clad laminate. As the pressing conditions, the press section of the pressing machine was adjusted to a degree of vacuum of 40 hPa, the material was hot pressed at the prescribed molding pressure with a temperature-elevating rate of 5° C./min, and upon reaching the prescribed molding temperature, the molding temperature was maintained for a prescribed period of time (molding time), and the hot pressing was then suspended and followed by air-cooling to restore the press section to atmospheric pressure. The molding pressure was 4.0 MPa, the molding temperature was 230° C. and the molding time was 90 minutes. A section of the double-sided copper-clad laminate was cut out, the copper foil on both sides was etched off and the thickness of the composite resin layer was measured with a micrometer, and this yielded results of 50-51 μm for all of Examples B-1 to B-16 and Comparative Example B-1.

(Fabrication of Sample for Evaluation of Mechanical Properties)

Two adhesive films were stacked, a 12 μm-thick electrolytic copper foil (trade name: F2-WS-12 by Furukawa Circuit Foil Co., Ltd.) was stacked onto both sides thereof with the roughened surface facing the adhesive film, and press laminated under pressing conditions with a molding pressure of 2.0 MPa, a molding temperature of 230° C. and a molding time of 60 minutes, after which the copper foil was etched to produce a sample for evaluation of the mechanical properties.

(Fabrication of Sample for Bending Test)

A line pattern with a 1 mm width and 100 mm length was formed on one side of the double-sided copper-clad laminate by etching, to prepare configuration 1. A resin-coated copper foil with the same composition was stacked onto both sides of the sample and laminated therewith under pressing conditions with a molding pressure of 4.0 MPa, a molding temperature of 230° C. and a molding time of 60 minutes, after which the copper foils on both sides were etched to prepare configuration 2.

[Evaluation Results]

(Evaluation of Base Material Embedding Property)

The prepreg of each of the examples and comparative examples and a 12 μm electrolytic copper foil (F2-WS-12, product of Furukawa Circuit Foil Co., Ltd.) were stacked onto both sides of a double-sided circuit board having a prescribed circuit pattern (conductor thickness: 12 μm, base material, 1-671 by Hitachi Chemical Co., Ltd.), with the roughened surfaces facing the prepreg, and then pressed under pressing conditions with a molding temperature of 230° C., a molding time of 60 minutes, and one of 3 different molding pressures of 4.0 MPa, 3.0 MPa and 2.0 MPa, to produce a double-sided copper-clad laminate. Next, the copper foil was etched off and the embedding property of the resin into the conductor sections was visually confirmed. Samples that were confirmed to have no surface level difference from the circuit pattern on the resin surface and uniform embedding across the entire surface, with no whitening due to voids between the substrate and the resin, were evaluated as "good", with those that were moldable at 2.0 MPa being assigned a value of "4", those that were moldable at 3.0 MPa being assigned a value of "3" and those that were moldable at 4.0 MPa being assigned a value of "2", while those with even one area of whitening due to voids between the substrate and the resin were evaluated as "poor", with a value of "1". The evaluation results are shown in Tables 3 and 4.

(Evaluation of Copper Foil Bonding Strength)

The copper foil bonding strength (peel strength) of the obtained metal-clad laminate was measured. The copper foil on one side of the metal-clad laminate was etched into a 5 mm-wide band, and the force upon peeling the copper foil at a rate of 50 mm/min in the direction of 90 degrees was measured with a rheometer by Fudo Industry Co., Ltd., calculated in terms of the peel strength per 10 mm width (2-fold) and recorded as the bonding strength. The evaluation results are shown in Tables 3 and 4. The results were 0.9-1.4 kN/m for all combinations of F2-WS-12 and the prepregs of Examples B-1 to B-15.

(Evaluation of Glass Bonding Strength)

The varnishes of each of Examples B-1 to B-16 and Comparative Example B-1 were coated onto UPILEX S (product name of Ube Industries, Ltd., thickness: 50 μm) as a polyimide film to a post-drying thickness of 50 μm, and were dried at 140° C. for 15 minutes. Slide glass was attached to the coated side of the polyimide film, and the pair was passed between laminating rolls with a linear pressure of 1 kg and a temperature of 130° C. at a linear speed of 0.1 m/min for lamination, after which the laminate was heat-treated at 180° C. for 1.5 hours. The polyimide film was cut into a 10 mm-wide band, and the force upon peeling the polyimide film at a rate of 50 mm/min in the direction of 90 degrees was measured with a rheometer by Fudo Industry Co., Ltd. and recorded as the glass bonding strength. The evaluation results are shown in Tables 3 and 4.

(Evaluation of Polyimide Bonding Strength)

The varnishes of each of Examples B-1 to B-16 and Comparative Example B-1 were coated onto UPILEX S (product name of Ube Industries, Ltd., thickness: 50 μm) as a polyimide film to a post-drying thickness of 50 μm, and were dried at 140° C. for 15 minutes. The coated sides of polyimide films were attached together and vacuum-pressed (200° C./2 MPa/1 hour), after which the polyimide film pair was cut into a 10 mm-wide band, and the force upon peeling the polyimide film at a rate of 50 mm/min in the direction of 180 degrees was measured with a rheometer by Fudo Industry Co., Ltd. and recorded as the polyimide bonding strength. The evaluation results are shown in Tables 3 and 4.

(Evaluation of Elastic Modulus)

The varnishes of each of Examples B-1 to B-16 and Comparative Example B-1 were coated onto F2-WS-12 copper foil (product name of Furukawa Circuit Foil Co., Ltd., thickness: 12 μm) to a post-drying thickness of 50 μm, and were dried at 140° C. for 15 minutes. Also, the coated sides were attached together and the pair were vacuum-pressed (200° C./2 MPa/1 hour), after which the copper foil was etched to prepare a resin film. A REO-GEL E-4000 dynamic viscoelasticity measuring apparatus (UBM Co.) was used to measure the dynamic viscoelasticity (storage elastic modulus E', loss elastic modulus E'', tan δ) from 30° C. to 350° C. at a temperature-elevating rate of 5° C./min. The evaluation results are shown in Tables 3 and 4.

(Evaluation of Tg)

The temperature at which tan δ was maximum during measurement of the elastic modulus was recorded as Tg. The evaluation results are shown in Tables 3 and 4.

(Evaluation of 5% Thermogravimetric Reduction Temperature)

The varnishes of each of Examples B-1 to B-16 and Comparative Example B-1 were coated onto F2-WS-12 copper foil (product name of Furukawa Circuit Foil Co., Ltd., thickness: 12 μm) to a post-drying thickness of 50 μm, and were dried at 140° C. for 15 minutes. Also, the coated sides were attached together and the pair was vacuum-pressed (200° C./2 MPa/1 hour), after which the copper foil was etched to prepare a resin film. The 5% thermogravimetric reduction temperature of the resin film was measured using a TG-DTA (product of Bruker Corp.). The measuring conditions were a temperature-elevating rate of 10° C./min, in air. The evaluation results are shown in Tables 3 and 4.

(Evaluation of Soldering Heat Resistance)

The obtained metal-clad laminate was dipped in solder baths at 260° C., 288° C. and 300° C., and the soldering heat resistance was measured. As a result, for all of the metal-clad laminates of Examples B-1 to B-16, and Comparative Example B-1, no abnormalities such as blister or peeling were seen for at least 5 minutes at all temperatures. This result was indicated as "good", and is shown in Tables 3 and 4.

(Evaluation of Bendability)

The bending test samples with configuration 1 and configuration 2 were used to evaluate the base material bendability. For both configuration 1 and configuration 2, samples that had no folding streaks or fracturing when a crease was formed by hand and were freely foldable were evaluated as "good", those that exhibited folding streaks were evaluated as "somewhat poor", and those with fracturing were evaluated as "poor". The evaluation results are shown in Tables 3 and 4. As a result, Examples B-1 to B-16 and Comparative Example B-1 all had excellent flexibility and were freely foldable.

(Evaluation of Mechanical Properties (Breaking Strength and Breaking Elongation))

The breaking strength and breaking elongation were measured as mechanical properties. The breaking strength and elongation of a test piece of the evaluation adhesive film cut to a 10 mm width and an 80 mm length were measured using a rheometer (EZ-Test by Shimadzu Corp.), under conditions with a chuck distance of 60 mm and a pull rate of 5 mm/min. The measurement was conducted in both the B stage and C-stage. The evaluation results are shown in Tables 3 and 4. The test pieces of the examples all had high elongation, whereas the test pieces of the comparative examples all had low elongation.

TABLE 3

| | Example B-1 | Example B-2 | Example B-3 | Example B-4 | Example B-5 | Example B-6 | Example B-7 | Example B-8 |
|---|---|---|---|---|---|---|---|---|
| Polyamideimide | Synthesis Ex. B-1 | Synthesis Ex. B-2 | Synthesis Ex. B-3 | Synthesis Ex. B-4 | Synthesis Ex. B-5 | Synthesis Ex. B-6 | Synthesis Ex. B-7 | Synthesis Ex. B-2 |
| Epoxy resin | NC3000H | NC3000H | NC3000H | NC3000H | NC3000H | NC3000H | NC3000H | EPPN502H |
| NV of polyamideimide (varnish solid content (wt %)) | 34 | 34 | 34 | 34 | 34 | 34 | 34 | 34 |
| PAI content (g) | 90 | 90 | 90 | 90 | 90 | 90 | 90 | 90 |
| Epoxy resin content (g) | 10 | 10 | 10 | 10 | 10 | 10 | 10 | 10 |
| B-stage breaking elongation (%) | 128 | 120 | 139 | 153 | 133 | 132 | 162 | 154 |
| B-stage breaking strength (MPa) | 4.3 | 4.1 | 5.2 | 4.8 | 4.5 | 4.6 | 5.3 | 4.5 |
| C-stage breaking elongation (%) | 135 | 140 | 148 | 166 | 147 | 138 | 172 | 165 |
| C-stage breaking strength (MPa) | 6.3 | 6.5 | 7.8 | 6.6 | 6.4 | 5.8 | 7.7 | 5.6 |
| Elastic modulus (MPa) | 58 | 65 | 72 | 59 | 54 | 59 | 70 | 61 |
| Tg (° C.) | 142 | 138 | 135 | 142 | 144 | 135 | 141 | 140 |
| Copper foil bonding strength (kN/m) | 1.3 | 1.2 | 1.4 | 1.4 | 1.1 | 1.3 | 1.2 | 1.2 |

TABLE 3-continued

|  | Example B-1 | Example B-2 | Example B-3 | Example B-4 | Example B-5 | Example B-6 | Example B-7 | Example B-8 |
|---|---|---|---|---|---|---|---|---|
| Glass bonding strength (kN/m) | ≥1.0 | ≥1.0 | ≥1.0 | ≥1.0 | ≥1.0 | ≥1.0 | ≥1.0 | ≥1.0 |
| Polyimide bonding strength (kN/m) | 1.2 | 1.2 | 1.1 | 1.3 | 1.1 | 1.1 | 1.2 | 1.0 |
| 5% Thermogravimetric reduction temp. (%) | 354 | 362 | 355 | 346 | 351 | 356 | 352 | 361 |
| Substrate embedding property | 4 | 4 | 4 | 4 | 4 | 4 | 4 | 4 |
| Solder heat resistance | Good | Good | Good | Good | Good | Good | Good | Good |
| Bendability | Good | Good | Good | Good | Good | Good | Good | Good |

TABLE 4

|  | Example B-9 | Example B-10 | Example B-11 | Example B-12 | Example B-13 | Example B-14 | Example B-15 | Example B-16 | Comp. Ex. B-1 |
|---|---|---|---|---|---|---|---|---|---|
| Polyamideimide | Synthesis Ex. B-2 | Synthesis Ex. B-2 | Synthesis Ex. B-2 | Synthesis Ex. B-2 | Synthesis Ex. B-8 | Synthesis Ex. B-9 | Synthesis Ex. B-10 | Synthesis Ex. A-1 | Comp. Synthesis Ex. B-1 |
| Epoxy resin | ZX1548-2 | DER331L | NC3000H | NC3000H | NC3000H | NC3000H | NC3000H | ZX1548-2 | NC3000H |
| NV of polyamideimide (varnish solid content (wt %)) | 34 | 34 | 34 | 34 | 38 | 40 | 43 | 29 | 33 |
| PAI content (g) | 90 | 90 | 80 | 70 | 90 | 90 | 90 | 90 | 90 |
| Epoxy resin content (g) | 10 | 10 | 20 | 30 | 10 | 10 | 10 | 10 | 10 |
| B-stage breaking elongation (%) | 126 | 151 | 112 | 103 | 124 | 210 | 105 | — | 95 |
| B-stage breaking strength (MPa) | 4.5 | 4.8 | 4.1 | 3.8 | 4.5 | 3.8 | 4.1 | — | 4 |
| C-stage breaking elongation (%) | 133 | 170 | 132 | 129 | 132 | 230 | 120 | 47 | 85 |
| C-stage breaking strength (MPa) | 5.8 | 6.1 | 7.5 | 8.4 | 6.3 | 4.5 | 8.4 | 27 | 4.8 |
| Elastic modulus (MPa) | 63 | 71 | 80 | 95 | 73 | 48 | 108 | 1150 | 110 |
| Tg (° C.) | 138 | 145 | 150 | 159 | 147 | 115 | 200 | 200 | 128 |
| Copper foil bonding strength (kN/m) | 1.3 | 1.1 | 1.1 | 0.9 | 1.1 | 1.1 | 1.3 | — | 1 |
| Glass bonding strength (kN/m) | ≥1.0 | ≥1.0 | 0.9 | 0.7 | ≥1.0 | 0.9 | 0.8 | 0.3 | 0.5 |
| Polyimide bonding strength (kN/m) | 1.1 | 1 | 0.9 | 0.8 | 0.9 | 1 | 1.1 | 0.8 | 1 |
| 5% Thermogravimetric reduction temp. (%) | 360 | 362 | 350 | 343 | 338 | 340 | 395 | 350 | 352 |
| Substrate embedding property | 4 | 4 | 4 | 4 | 4 | 4 | 4 | 2 | 2 |
| Solder heat resistance | Good | Good | Good | Good | Good | Good | Good | Good | Good |
| Bendability | Good | Good | Good | Good | Good | Good | Good | Good | Somewhat poor |

It was thus confirmed that the resin compositions of Examples B-1 to B-16 had more excellent moldability and could form products with lower reduction in cured elongation, with the ability to fold when formed into printed circuit boards and capable of being housed at high density in electronic device packages, compared to the resin composition of Comparative Example B-1. In addition, the resin compositions of Examples B-1 to B-15 were confirmed to have satisfactory adhesion with copper foil, glass and polyimides used as materials for circuit boards, while exhibiting a low elastic modulus after curing, compared to the resin compositions of Example B-16 and Comparative Example B-1.

EXPLANATION OF SYMBOLS

2: Base material, 20: resin layer, 20a: resin-cured layer, 40: composite resin layer, 100: prepreg, 200: metal foil with a resin, 300: adhesive film, 400: metal-clad laminate.

The invention claimed is:

1. A resin composition comprising a polyamideimide and an epoxy resin with 2 or more glycidyl groups,
the polyamideimide having on at least one end of the molecular chain two or more carboxyl groups, wherein the two or more carboxyl groups nearest to each other on the at least one end of the molecular chain comprise respective carbon atoms to which the two or more carboxyl groups are bonded, wherein the respective carbon atoms are separated by at least one carbon atom, and wherein the polyamideimide is obtained by reacting a dicarboxylic acid and a diisocyanate in a proportion of 1.05-1.45 mol of the diisocyanate to 1 mol of the dicarboxylic acid to form a product, wherein the dicarboxylic acid is a diimidedicarboxylic acid, and then further reacting the product with an aromatic tricarboxylic acid which does not undergo dehydrating cyclization.

2. The resin composition according claim 1, wherein at least one end of the molecular chain of the polyamideimide is an aromatic amide group with 2 or more carboxyl groups.

3. The resin composition according to claim 1, wherein the aromatic tricarboxylic acid which does not undergo dehydrating cyclization is selected from 1,3,5-benzenetricarboxylic acid, 1,3,5-naphthalenetricarboxylic acid, 1,3,7-naphthalenetricarboxylic acid, or 1,5,7-naphthalenetricarboxylic acid.

4. A cured product of the resin composition according to claim 1.

5. The resin composition according to claim 1, wherein the diimidedicarboxylic acid has been obtained by reacting a diamine and trimellitic anhydride.

6. The resin composition according to claim 5, wherein said diamine is selected from the group consisting of aliphatic diamines, aromatic diamines and mixtures thereof.

7. The resin composition according to claim 6, wherein said diamine includes a terminal aminated polypropylene glycol.

* * * * *